United States Patent
Lim et al.

(10) Patent No.: US 9,941,009 B2
(45) Date of Patent: Apr. 10, 2018

(54) MEMORY DEVICE HAVING VERTICAL STRUCTURE AND MEMORY SYSTEM INCLUDING THE SAME

(71) Applicants: Bong-soon Lim, Seoul (KR); Sang-won Shim, Seoul (KR)

(72) Inventors: Bong-soon Lim, Seoul (KR); Sang-won Shim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/433,310

(22) Filed: Feb. 15, 2017

(65) Prior Publication Data
US 2017/0330624 A1 Nov. 16, 2017

(30) Foreign Application Priority Data
May 16, 2016 (KR) .................. 10-2016-0059775

(51) Int. Cl.
G11C 16/02 (2006.01)
G11C 16/04 (2006.01)
H01L 23/528 (2006.01)
G11C 16/08 (2006.01)
H01L 27/11573 (2017.01)
(Continued)

(52) U.S. Cl.
CPC ...... *G11C 16/0466* (2013.01); *G11C 16/0483* (2013.01); *G11C 16/08* (2013.01); *G11C 16/10* (2013.01); *G11C 16/26* (2013.01); *G11C 16/30* (2013.01); *G11C 16/349* (2013.01); *H01L 23/528* (2013.01); *H01L 27/11568* (2013.01); *H01L 27/11573* (2013.01); *H01L 27/11582* (2013.01); *G11C 16/06* (2013.01); *G11C 16/12* (2013.01); *G11C 16/24* (2013.01)

(58) Field of Classification Search
CPC . G11C 16/0466; G11C 16/0483; G11C 16/06; G11C 16/08; G11C 16/10; G11C 16/12; G11C 16/14; G11C 16/24; G11C 16/26; G11C 16/28; G11C 16/349; G11C 16/3427; G11C 16/30; H01L 23/528; H01L 27/11568; H01L 11/573
USPC .......... 365/185.02, 185.17, 185.18, 185.23, 365/185.28, 51, 63, 72, 130, 185.11, 365/230.03
See application file for complete search history.

(56) References Cited

U.S. PATENT DOCUMENTS 7,190,602 B2  3/2007  Johnson et al.
7,260,670 B2 * 8/2007  Kawai ............... G11C 16/3418
                                                          365/200
(Continued)

FOREIGN PATENT DOCUMENTS

KR   20150129360 A   11/2015
KR   20160029236 A   3/2016

*Primary Examiner* — Tan T. Nguyen
(74) *Attorney, Agent, or Firm* — Harness, Dickey & Pierce, P.L.C.

(57) ABSTRACT

A memory device has a vertical structure in which a row decoder, a page buffer, and a peripheral circuit are disposed under a memory cell array. The row decoder and the page buffer may be asymmetrically disposed. The peripheral circuit is disposed in an area where the row decoder and the page buffer are not disposed. The row decoder and the page buffer may be symmetrically disposed with respect to an interface of planes. The peripheral circuit may be disposed in an area including a part of the interface of the planes.

19 Claims, 31 Drawing Sheets

(51) Int. Cl.
*H01L 27/11568* (2017.01)
*G11C 16/10* (2006.01)
*G11C 16/26* (2006.01)
*H01L 27/11582* (2017.01)
*G11C 16/34* (2006.01)
*G11C 16/30* (2006.01)
*G11C 16/24* (2006.01)
*G11C 16/12* (2006.01)
*G11C 16/06* (2006.01)

(56) References Cited

U.S. PATENT DOCUMENTS

| | | | |
|---|---|---|---|
| 8,044,448 B2 | 10/2011 | Kamigaichi et al. | |
| 8,338,882 B2 | 12/2012 | Tanaka et al. | |
| 8,508,967 B2 * | 8/2013 | Yamazaki | G11C 5/025 365/149 |
| 8,667,368 B2 | 3/2014 | Gupta et al. | |
| 9,019,739 B2 * | 4/2015 | Park | G11C 5/025 365/51 |
| 9,042,161 B2 | 5/2015 | Koyama et al. | |
| 9,111,592 B2 | 8/2015 | Maejima | |
| 9,165,654 B1 | 10/2015 | Oh et al. | |
| 9,508,738 B2 | 11/2016 | Lee et al. | |
| 2010/0080066 A1 * | 4/2010 | Watanabe | G11C 16/0433 365/185.23 |
| 2011/0068179 A1 * | 3/2011 | Lo Giudice | G11C 16/0433 235/492 |
| 2011/0205808 A1 * | 8/2011 | Takahashi | G11C 16/0433 365/185.23 |
| 2012/0063223 A1 * | 3/2012 | Lee | G11C 16/0433 365/185.02 |
| 2014/0061747 A1 | 3/2014 | Tanzawa et al. | |
| 2014/0146612 A1 | 5/2014 | Helm et al. | |
| 2016/0071877 A1 | 3/2016 | Kim et al. | |
| 2016/0163386 A1 * | 6/2016 | Hwang | G11C 5/025 365/185.12 |

* cited by examiner

MEMORY DEVICE HAVING VERTICAL STRUCTURE AND MEMORY SYSTEM INCLUDING THE SAME

CROSS-REFERENCE TO RELATED APPLICATION

This application claims the benefit of Korean Patent Application No. 10-2016-0059775, filed on May 16, 2016, in the Korean Intellectual Property Office, the disclosure of which is incorporated herein in its entirety by reference.

BACKGROUND

Inventive concepts relate to a memory device, and more particularly, to a memory device having vertical structure and a memory system including the same.

Semiconductor memory devices may include memory cell arrays including memory cells, each having a state that varies according to stored data. Memory cells may be accessed through words lines and bit lines arranged in a memory cell array. The semiconductor memory device may include a circuit configured to access memory cells by controlling the word lines and the bit lines. In addition, the semiconductor memory device may further include circuits configured to perform externally requested actions, for example, write or read actions.

SUMMARY

The inventive concept provides a semiconductor memory device, particularly a memory device having a vertical structure and a memory system including the same.

According to an example embodiment of inventive concepts, there is provided a memory device. The memory device includes a first semiconductor layer and a second semiconductor layer. The first semiconductor layer includes a memory cell array that includes a plurality of word lines extending in a first direction and a plurality of bit lines extending in a second direction that crosses the first direction. The second semiconductor layer is under the first semiconductor layer in a third direction perpendicular to the first and second directions such that the first semiconductor layer is on the second semiconductor layer. The second semiconductor layer includes a substrate, a plurality of row decoder circuits, a plurality of page buffer circuits, and a peripheral circuit. The plurality of row decoder circuits at least partially overlap the memory cell array in the third direction. The plurality of page buffer circuits at least partially overlap the memory cell array in the third direction. In the second semiconductor layer, at least two row decoder circuits of the plurality of row decoder circuits have different areas, or at least two page buffer circuits of the plurality of page buffer circuits have different areas.

According to another example embodiment of inventive concepts, a memory device includes a first semiconductor layer and a second semiconductor layer under the first semiconductor layer in a vertical direction such that the first semiconductor layer is on the second semiconductor layer. The first semiconductor layer includes first and second memory cell arrays that are adjacent to each other in a horizontal direction. The second semiconductor layer includes a substrate, a first row decoder circuit and a first page buffer circuit that are configured to control the first memory cell array, and a second row decoder circuit and a second page buffer circuit that are configured to control the second memory cell array, and a peripheral circuit. The first row decoder circuit and the first page buffer circuit are in a first plane region of the second semiconductor layer. The first plane region overlaps the first memory cell array in a vertical direction. The second row decoder circuit and the second page buffer circuit are in a second plane region of the second semiconductor layer. The second plane region overlaps the second memory cell array in the vertical direction. The peripheral circuit includes a first sub-circuit in an area of the second semiconductor layer that includes at least a part of an interface between the first and second plane regions and at least partially overlaps the first and second memory cell arrays in the vertical direction.

According to another example embodiment of inventive concepts, a memory device includes a first semiconductor layer including a first memory cell array and a second semiconductor layer connected to the first semiconductor layer. The second semiconductor layer includes a plurality of row decoder circuits, a plurality of page buffer circuits, and at least one peripheral circuit. The first semiconductor layer is on top of the second semiconductor layer. The plurality of row decoder circuits includes a first row decoder circuit and a second row decoder circuit. The plurality of page buffer circuits include a first page buffer circuit and a second page buffer circuit. The first memory cell array is on top of a plane region in the second semiconductor layer that includes the first row decoder circuit, the second row decoder circuit, the first page buffer circuit, the second page buffer circuit, and a portion of the at least one peripheral circuit.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
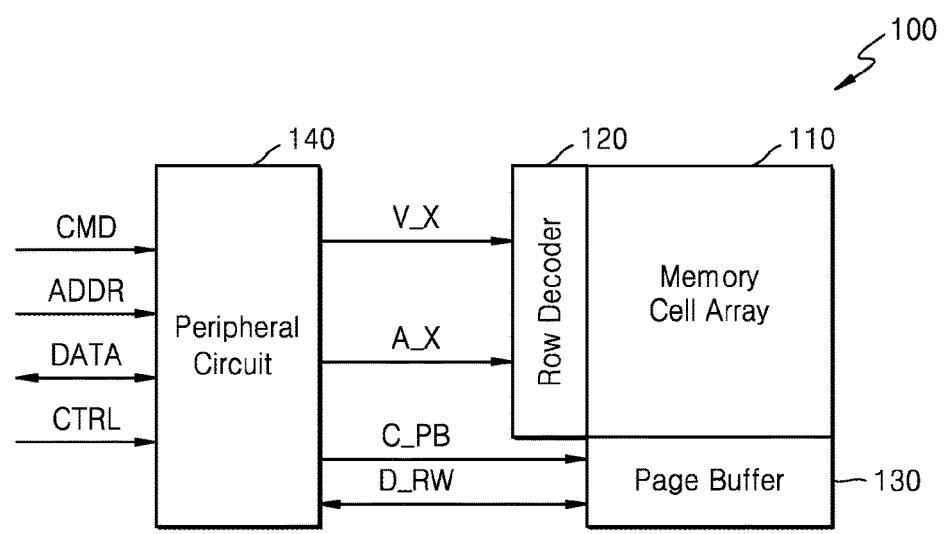
FIG. 1 is a block diagram of a memory device according to an example embodiment.

FIG. 1 is a block diagram of a memory device 100 according to an example embodiment. As illustrated in FIG. 1, the memory device 100 may include a memory cell array 110, a row decoder 120, a page buffer 130, and a peripheral circuit 140.

The memory cell array 110 may include a plurality of memory cells, each having a state that varies according to stored data. The memory cells may be arranged in the memory cell array 110 and may be accessed through a plurality of word lines and a plurality of bit lines. The memory cells may be volatile memory cells where stored data is lost when supplied power is cut off or non-volatile memory cells where the stored data is maintained even when the supplied power is cut off. For example, when the memory cell is a volatile memory cell, the memory device 100 may be dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, or Rambus dynamic random access memory (RDRAM). Also, when the memory cell is a non-volatile memory cell, the memory device 100 may be non-volatile memories such as an electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), or ferroelectric random access memory (FRAM). Also, the memory device 100 may be a hybrid memory device in which the memory cell array 110 includes both of a volatile memory cell and a non-volatile memory cell. In the following description, the memory device 100 is described to be a vertical NAND flash device with reference to FIGS. 3 to 5. However, inventive concepts are not limited thereto.

Referring to FIG. 1, the row decoder 120 may receive a drive voltage V_X and a row address A_X from the peripheral circuit 140, and control the word lines arranged in the memory cell array 110. For example, the row decoder 120 may activate at least one of the word lines based on the row address A_X, and apply the drive voltage V_X to a selected word line. The memory cells selected by the word lines that the row decoder 120 activated based on the row address A_X may be referred to as a page, and data may be written to the memory cell array 110 or read from the memory cell array 110 in units of pages.

As a degree of integration of the memory cell array 110 and an operating speed of the memory device 100 increase, due to a delay in a signal applied to the word line, the row decoder 120 may not only be disposed adjacent to the memory cell array 110, but also include identical circuits repeatedly arranged adjacent to the respective word lines arranged in the memory cell array 110. Accordingly, the row decoder 120 may be disposed to have a shape extending in a direction in which the word lines are arranged, for example, in a direction perpendicular to a direction in which the word lines extend. For example, the row decoder 120 may have a length that is substantially the same or similar to the memory cell array 110 in the direction in which the word lines are arranged.

Referring to FIG. 1, the page buffer 130 may receive a page buffer control signal C_PB from the peripheral circuit 140, and transceive a data signal D_RW with respect to the peripheral circuit 140. The page buffer 130 may control the bit lines arranged in the memory cell array 110 in response to the page buffer control signal C_PB. For example, the page buffer 130 in response to the page buffer control signal C_PB detects a signal of a bit line and thus detects data stored in the memory cell of the memory cell array 110 and transmits the data signal D_RW to the peripheral circuit 140 according to the detected data. Also, the page buffer 130 in response to the page buffer control signal C_PB may apply a signal to the bit line based on the data signal D_RW received from the peripheral circuit 140 and thus write data to the memory cell of the memory cell array 110. The page buffer 130, as described above, may write data to or read data from the memory cell connected to the word line activated by the row decoder 120.

The page buffer 130 may include a read circuit for performing a data read operation, a write circuit for performing a data write operation, and a plurality of latches for temporarily storing data. The read circuit, the write circuit, and the latches may be arranged at each bit line. Although not illustrated in FIG. 1, the page buffer 130 may include a column decoder and receive a column address from the peripheral circuit 140. When the page buffer 130 includes a column decoder, the read circuit, the write circuit, and the latches may be arranged at each output line of the column decoder, instead of being arranged in units of bit lines.

Similar to the row decoder 120, as a degree of integration of the memory cell array 110 and an operating speed of the memory device 100 increase, due to a delay in a signal applied by the page buffer 130 to the bit line or a signal received by the page buffer 130 through the bit line, the page buffer 130 may not only be disposed adjacent to the memory cell array 110, but also include identical circuits repeatedly arranged adjacent to each of the bit lines arranged in the memory cell array 110. Accordingly, the page buffer 130 may be disposed to have a shape extending in a direction in which the bit lines are arranged, for example, in a direction perpendicular to a direction in which the bit lines extend. For example, the page buffer 130 may have a length that is substantially the same or similar to the memory cell array 110 in the direction in which the bit lines are arranged.

Referring to FIG. 1, the peripheral circuit 140 may receive a command signal CMD, an address signal ADDR, and a control signal CTRL from the outside of the memory device 100, and transceive data DATA with respect to an apparatus, for example, a memory controller, outside the memory device 100. The peripheral circuit 140 may output signals, for example, the row address A_X or the page buffer control signal C_PB, to write data to the memory cell array 110 or read data from the memory cell array 110, based on the command signal CMD, the address signal ADDR, and the control signal CTRL. The peripheral circuit 140 may include a plurality of sub-circuits. The sub-circuits of the peripheral circuit 140 may include a voltage generation circuit for generated various voltages, including the drive voltage V_X, needed for an operation of the memory device 100, and include an error correction circuit for correcting an error of data read from the memory cell array 110. A detailed description of the peripheral circuit 140 is presented later with reference to FIG. 8.

Figure 2:
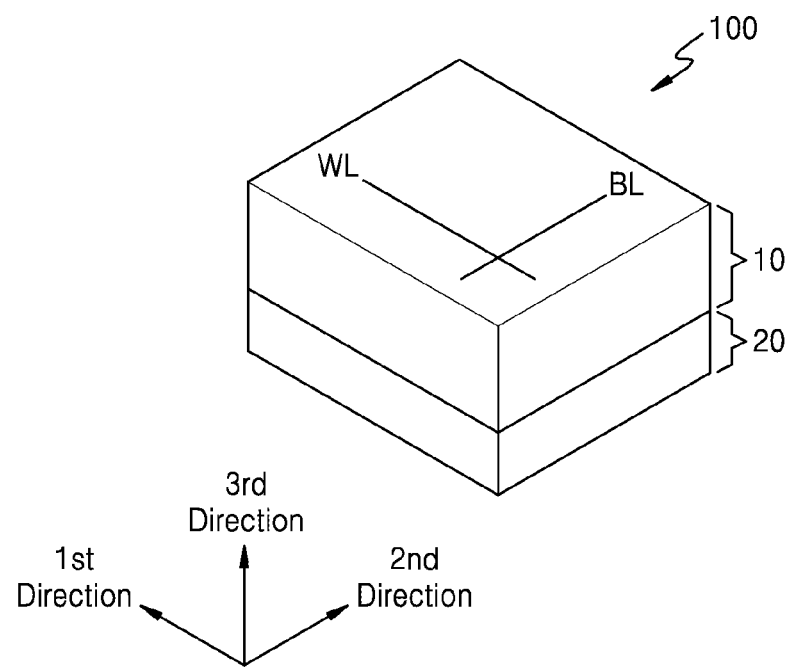
FIG. 2 schematically illustrates a structure of the memory device of FIG. 1, according to an example embodiment.

FIG. 2 schematically illustrates a structure of the memory device 100 of FIG. 1, according to an example embodiment. As described above in FIG. 1, the memory device 100 may include the memory cell array 110, the row decoder 120, the page buffer 130, and the peripheral circuit 140, and the elements of the memory device 100 may be formed in a semiconductor manufacturing process. FIG. 1 is also referred to in the following description of FIG. 2.

Referring to FIG. 2, the memory device 100 may include a first semiconductor layer 10 and a second semiconductor layer 20, and the first semiconductor layer 10 may be stacked on the second semiconductor layer 20 in a third direction. According to an example embodiment, the memory cell array 110 of FIG. 1 may be formed in the first semiconductor layer 10, and the row decoder 120, the page buffer 130, and the peripheral circuit 140 may be formed in the second semiconductor layer 20. In other words, the second semiconductor layer 20 may include a substrate, and semiconductor devices such as transistors and a pattern for wiring devices are formed on the substrate. Accordingly, circuits, for example, circuits corresponding to the row decoder 120, the page buffer 130, and the peripheral circuit 140 may be formed in the second semiconductor layer 20.

After the circuits are formed in the second semiconductor layer 20, the first semiconductor layer 10 including the memory cell array 110 may be formed, and patterns for electrically connecting the memory cell array 110 (e.g. the word lines WL and the bit lines BL) and the circuits (e.g. the circuits corresponding to the row decoder 120 and the page buffer 130) formed in the second semiconductor layer 20 may be formed. Accordingly, the memory device 100 may have a structure, that is, a Cell-On-Peri or Cell-Over-Peri (COP) structure, in which the memory cell array 110 and other circuits, that is, the circuits corresponding to the row decoder 120, the page buffer 130, and the peripheral circuit 140 are disposed in a stacking direction, that is, the third direction. As the circuits, except for the memory cell array 110, are disposed under the memory cell array 110, the COP structure may effectively decrease an area occupying on a surface perpendicular to the stacking direction. Accordingly, the number of the memory devices 100 manufactured from one wafer may be increased.

As illustrated in FIG. 2, in the first semiconductor layer 10 where the memory cell array 110 is formed, the word lines WL may extend in the first direction perpendicular to the stacking direction, that is, the third direction, and the bit lines BL may extend in the second direction perpendicular to the stacking direction, that is, the third direction. As described above, the memory cells included in the memory cell array 110 may be accessed through the word lines WL and the bit lines BL, and the word lines WL and the bit lines BL may be electrically connected to the circuits formed in the second semiconductor layer 20, for example, the circuits corresponding to the row decoder 120 and the page buffer 130.

As described above, each of the row decoder 120 and the page buffer 130 may be disposed in a particular direction to have the same length as the memory cell array 110. Accordingly, disposing the peripheral circuit 140 in the second semiconductor layer 20 may have constraints due to the dispositions of the row decoder 120 and the page buffer 130. Accordingly, some circuits included in the peripheral circuit 140 may be formed in the second semiconductor layer 20 without overlapping the memory cell array 110. As a result, an area of the memory device 100, that is, a planar area perpendicular to the third direction, may be increased, and improvement of a degree of integration of the memory device 100 may be restricted. As described below, the memory device 100 according to an example embodiment may solve the restrictions on the disposition of the peripheral circuit 140 so that the COP structure may be practically implemented in the memory device 100. Accordingly, a degree of integration of the memory device 100 may be improved.

Although not illustrated in FIG. 2, a plurality of pads for electrical connection to the outside of the memory device 100 may be disposed. For example, a plurality of pads for the command signal CMD, the address signal ADDR, and the control signal CTRL received from the apparatus, for example, a memory controller, outside the memory device 100, and a plurality of pads for inputting/outputting data DATA may be disposed. The pads may be disposed adjacent to each other in a vertical direction, that is, the third direction, or a horizontal direction, that is, the second direction, with respect to the peripheral circuit 140 that processes the signal received from the outside of the memory device 100 or the signal transmitted to the outside of the memory device 100.

Figure 3:
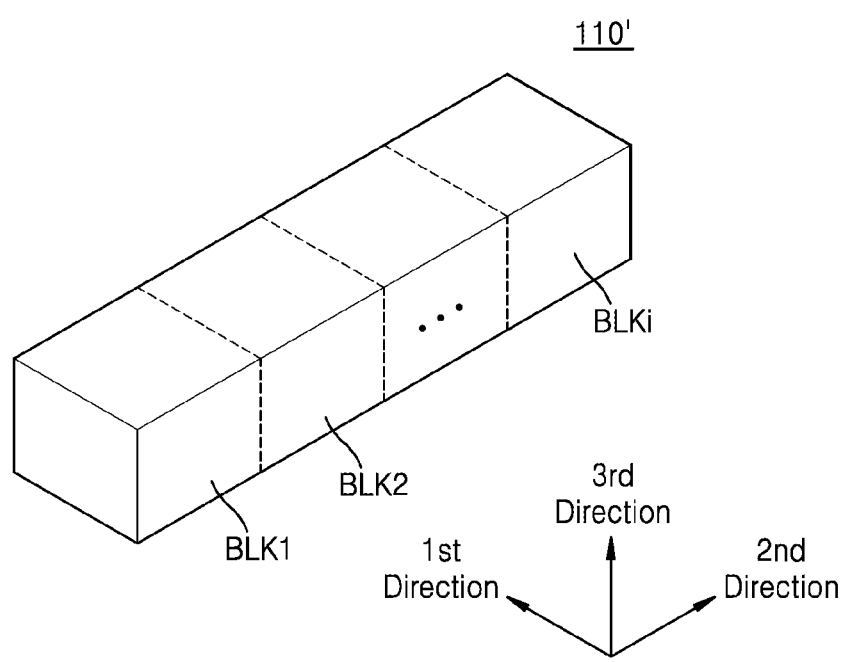
FIG. 3 illustrates an example of a memory cell array of FIG. 1, according to an example embodiment FIG. 1.

FIG. 3 illustrates an example of the memory cell array 110 of FIG. 1, according to an example embodiment FIG. 1. Referring to FIG. 3, a memory cell array 110 may include a plurality of memory blocks BLK1 to BLKi.

Each of the memory blocks BLK1 to BLKi may have a three-dimensional (3D) structure or a vertical structure. In detail, each of the memory blocks BLK1 to BLKi may include structures extending in the first to second directions. For example, each memory block may include a plurality of strings extending in the third direction. The strings may be provided by being separated by a particular distance in the first and second directions.

The memory blocks BLK1 to BLKi may be selected by the row decoder 120. For example, the row decoder 120 may select a memory block corresponding to a block address from among the memory blocks BLK1 to BLKi. Detailed descriptions about the memory blocks BLK1 to BLKi are presented below with reference to FIGS. 4A and 4B.

Figure 4A:
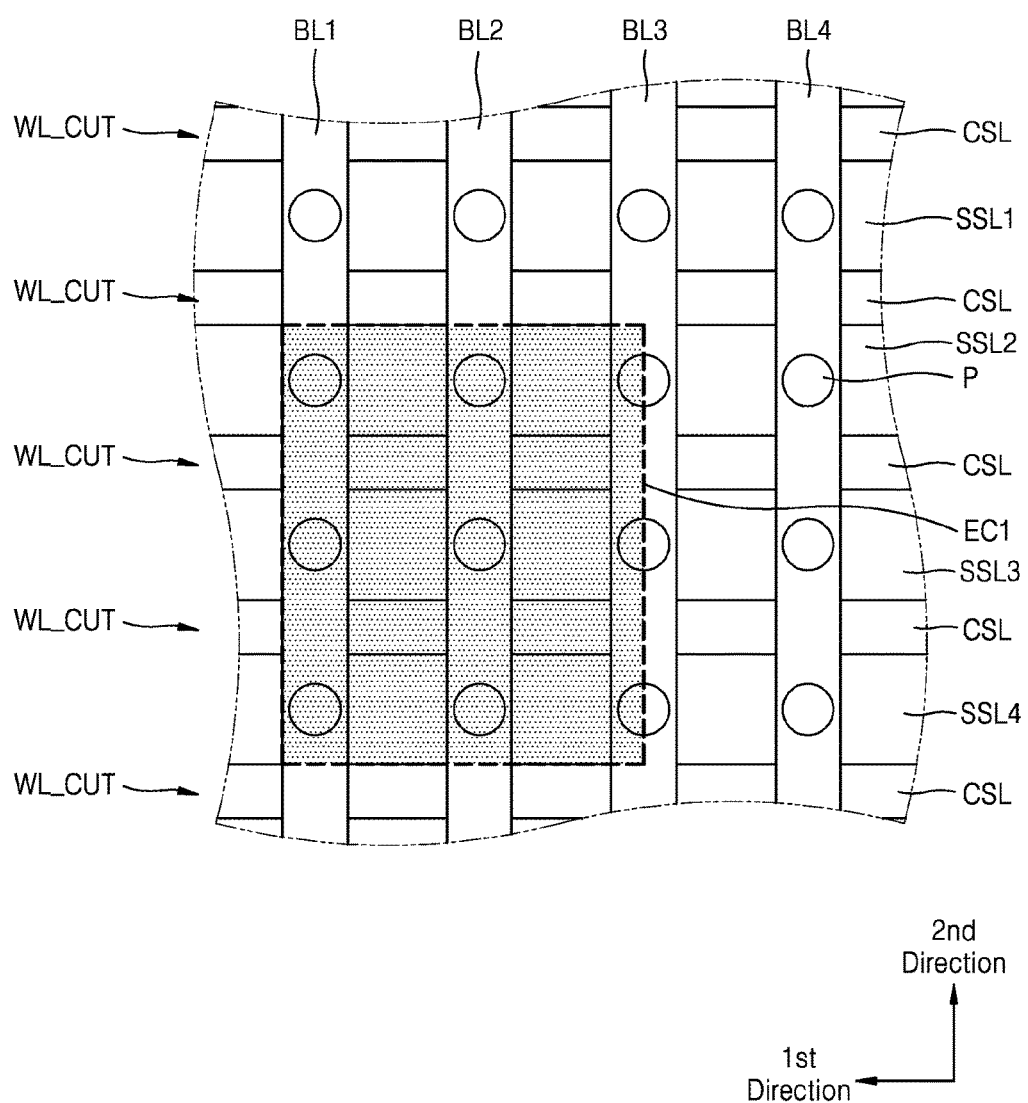
FIG. 4A is a plan view of a part of one of memory blocks of FIG. 3, according to an example embodiment.
Figure 4B:
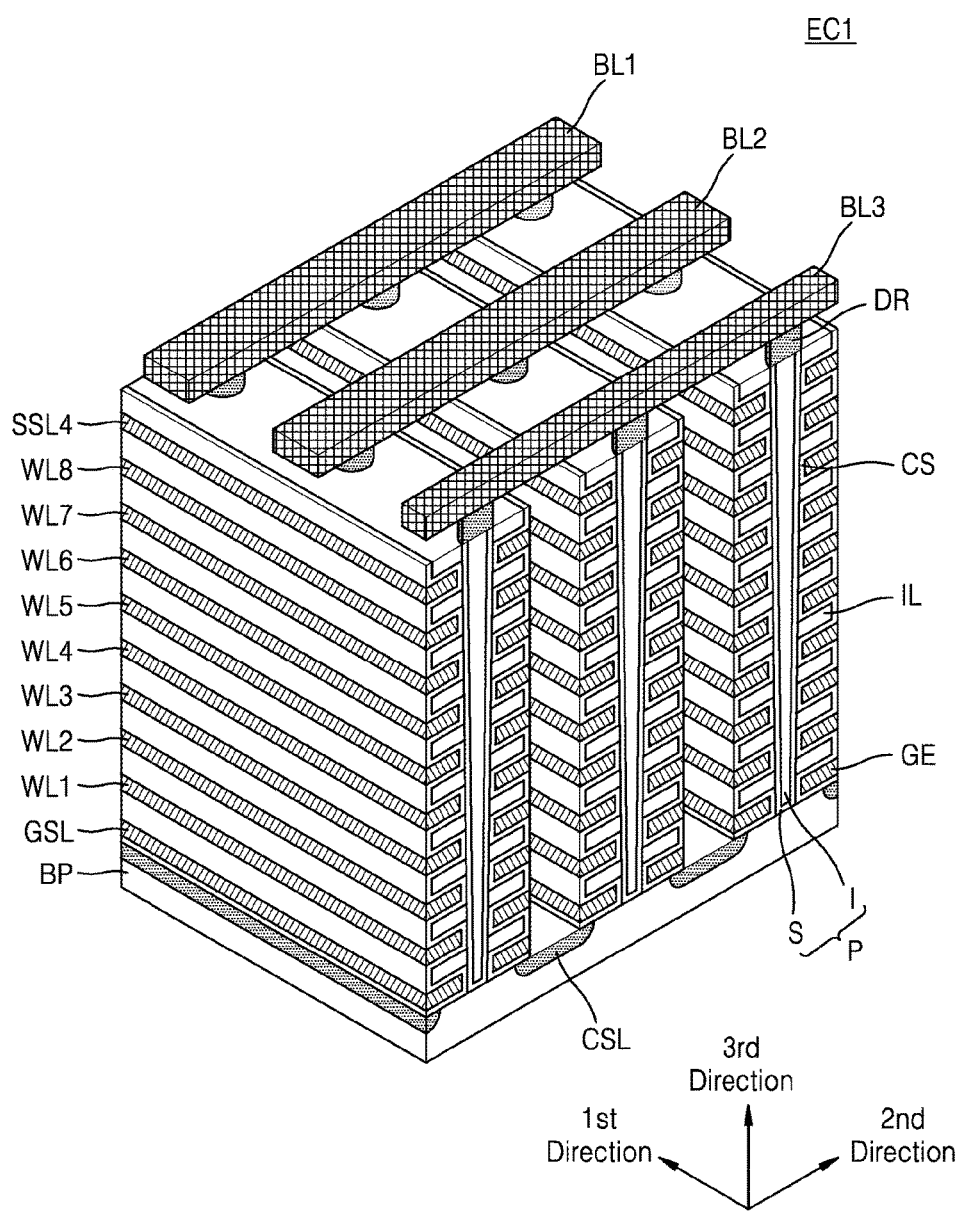
FIG. 4B is a perspective view of a part of the plan view of FIG. 4A.

FIG. 4A is a plan view of a part of a memory block BLKx that is one of the memory blocks BLK1 to BLKi of FIG. 3, according to an example embodiment. FIG. 4B is a perspective view of a part EC1 of the plan view of FIG. 4A. Referring to FIGS. 4A and 4B, 3D structures extending in the first to third directions are provided.

The memory block BLKx may be formed in a direction perpendicular to a base plate BP, that is, in the third direction perpendicular to the first and second directions. Referring to FIG. 4A, a plurality of bit lines BL1 to BL4 extending in the second direction and a plurality of string selection lines SSL1 to SSL4 extending in the first direction may be arranged crossing each other. Although FIGS. 4A and 4B illustrate that the string selection lines SSL1 to SSL4, eight word lines WL1 to WL8, a ground selection line GSL, and four bit lines BL1 to BL4 are arranged at each of a plurality of levels in the third direction in the memory block BLKx, the actual number of the above elements may be more or less.

The base plate BP may include a semiconductor and may have a first conductive type, for example, p-type. A common source line CSL doped with impurities of a second conductive type, for example, n-type, and extending in the first direction may be arranged on the base plate BP. A plurality of insulating layers IL extending in the first direction may be sequentially stacked in the third direction in an area of the base plate BP between the two neighboring common source lines CSL. The insulating layers IL may be spaced apart from each other by a particular distance in the third direction. For example, the insulating layers IL may include an insulating material such as a silicon oxide.

A plurality of pillars P sequentially arranged in the first direction and penetrating through the insulating layers IL in the third direction may be formed in the area of the base plate BP between the two neighboring common source lines CSL. For example, the pillars P may contact the base plate BP by penetrating through the insulating layers IL. In detail, a surface layer S of each pillar P may include a semiconductor such as silicon material having a second conductive type and function as a channel region. Interior I of each pillar P may include an insulating material such as a silicon oxide, or may be an air gap. For convenience of explanation, the pillars P are illustrated in the plan view of FIG. 4A.

A charge storage layer CS may be formed along exposed surfaces of the insulating layers IL, the pillars P, and the substrate BP in an area between the two neighboring common source lines CSL. For example, the charge storage layer CS may have an oxide-nitride-oxide (ONO) structure. Also, a gate electrode GE may be provided on an exposed surface of the charge storage layer CS in the area between the two neighboring common source lines CSL.

A conductive material may be formed on the exposed surfaces of the charge storage layer CS between the insulating layers IL, and may be separated by word line cuts WL_CUT, thereby forming gate lines, for example, the string selection lines SSL, the word lines WL1 to WL8, and the ground selection line GSL, extending in the first direction. For example, the word line cut WL_CUT may include an insulating material or may be an air gap, and the gate line may include a metal conductive material or a non-metal conductive material such as polysilicon.

Drains DR may be disposed on the pillars P. For example, the drains DR may include a silicon material doped with impurities having a second conductive type. The bit lines BL1 to BL4 extending in the second direction and spaced apart from each other by a particular distance in the first direction may be arranged on the drains DR.

Figure 5:
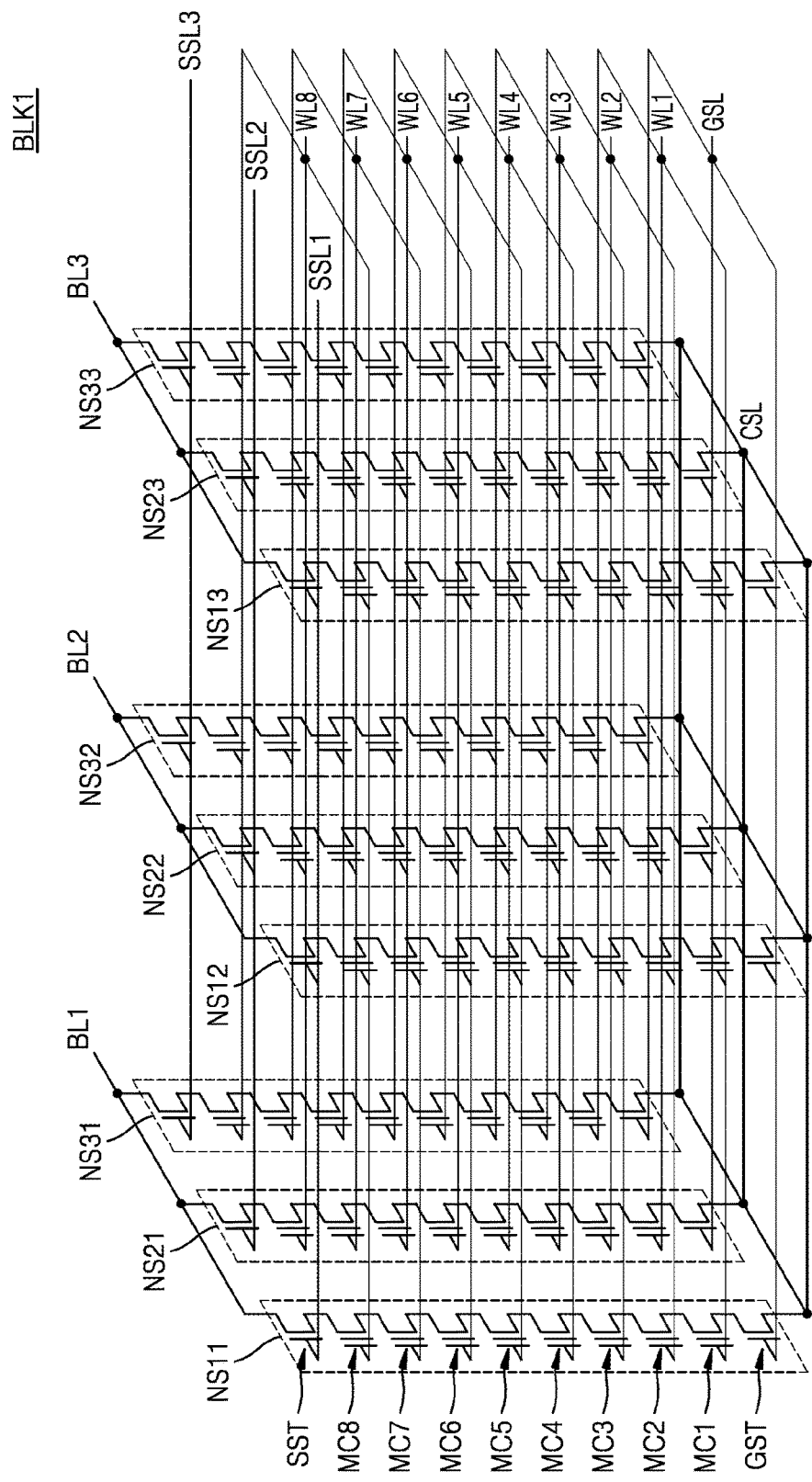
FIG. 5 is an equivalent circuit diagram of one of the memory blocks of FIG. 3, according to an example embodiment.

FIG. 5 is an equivalent circuit diagram of the memory block BLK1 that is one of the memory blocks BLK1 to BLKi of FIG. 3, according to an example embodiment.

Referring to FIG. 5, the memory block BLK1 may be a NAND flash memory having a vertical structure. The memory blocks BLK1 to BLKi of FIG. 3 may be expressed as in FIG. 5. Each of a plurality of strings NS11 to NS13, NS21 to NS23, and NS31 to NS33 in FIG. 5 may include a string selection transistor SST, eight memory cell transistors MC1 to MC8, and a ground selection transistor GST. However, inventive concepts are not limited thereto. For example, the strings may further include at least one dummy cell transistor between the string selection transistor SST and the cell transistor MC8 and at least one dummy cell transistor between the ground selection transistor GST and the cell transistor MC1.

Referring to FIG. 5, the memory block BLK1 may include the strings, for example, NS11, NS12, and NS13, and the bit lines BL1 to BL3, the string selection lines SSL1 to SSL3, the word lines WL1 to WL8, the ground selection line GSL, and the common source line CSL may be arranged in the memory block BLK1. The number of strings, the number of word lines, the number of bit lines, the number of ground selection lines, and the number of string selection lines may be variously changed according to example embodiments.

Three strings may be provided between each of the bit lines BL1 to BL3 and the common source line CSL. For example, the string NS11 may include the ground selection transistor GST serially connected between the common source line CSL and the bit line BL1, the memory cell transistors MC1 to MC8, and the string selection transistor SST. The ground selection transistor GST and the string selection transistor SST may be referred to as auxiliary cell transistors, and the string may be referred to as a NAND string.

The strings commonly connected to one bit line may form one column. For example, the three strings NS11, NS21, and NS31 commonly connected to the first bit line BL1 may correspond to a first column, the three strings NS12, NS22, and NS32 commonly connected to the second bit line BL2 may correspond to a second column, and the three strings NS13, NS23, and NS33 commonly connected to the third bit line BL3 may correspond to a third column.

The strings connected to one string selection line may form one row. For example, the strings NS11, NS12, and NS13 connected to the string selection line SSL1 may correspond to a first row, the strings NS21, NS22, and NS23 connected to the string selection line SSL2 may correspond to a second row, and the strings NS31, NS32, and NS33 connected to the string selection line SSL3 may correspond to a third row.

The memory cell transistors MC1 to MC8 may be respectively connected to the word lines WL1 to WL8 corresponding thereto. In detail, gates of the memory cell transistors MC1 to MC8 may be connected to the word lines WL1 to WL8 corresponding thereto. Also, as illustrated in FIG. 4, memory cell transistors arranged at the same level (height from the substrate) may be connected to the same word line. Accordingly, gates of the memory cell transistors at the same level may be formed to have the same electric potential.

The string selection transistors SST included in each string may be connected to each of the string selection lines SSL1 to SSL3, and the ground selection transistors GST may be connected to the ground selection line GSL. Also, a drain of each of the string selection transistors SST may be connected to the bit line BL corresponding thereto, and a source of each of the ground selection transistors GST may be connected to the common source line CSL.

A memory cell transistor to access may be selected by selecting one of the string selection lines SSL1 to SSL3 and one of the word lines WL1 to WL8. For example, when a selection voltage V_ON is applied to the string selection line SSL1 and a read voltage is applied to the third word line WL3, the memory cell transistors included in the strings of the first row and connected to the third word line WL3 may be accessed.

In the following description, the memory cell array of the memory device is a NAND flash memory having a vertical structure as described in FIGS. 3 to 5. However, inventive concepts are not limited thereto.

Figure 6A:
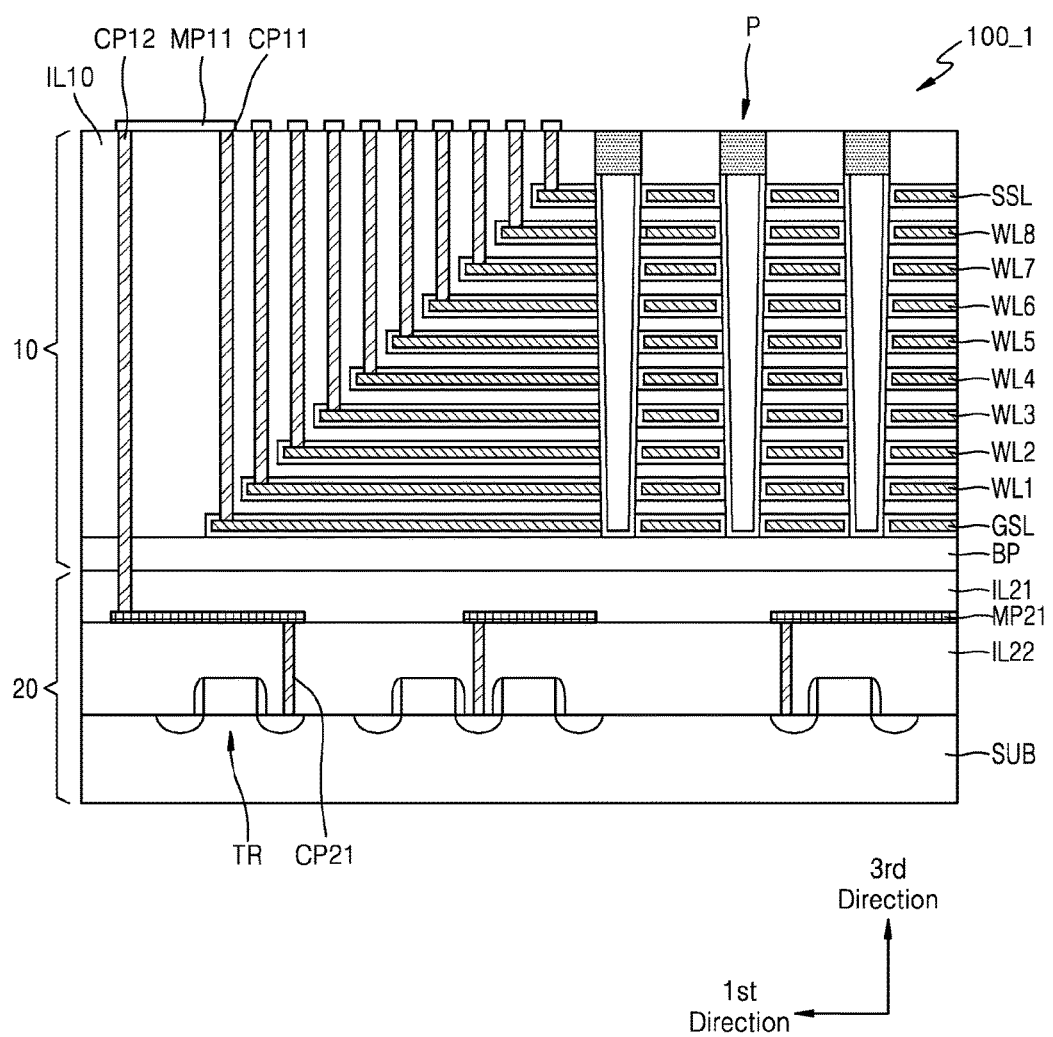
FIGS. 6A to 6C are cross-sectional views of examples of semiconductor memory devices according to example embodiments.
Figure 6B:
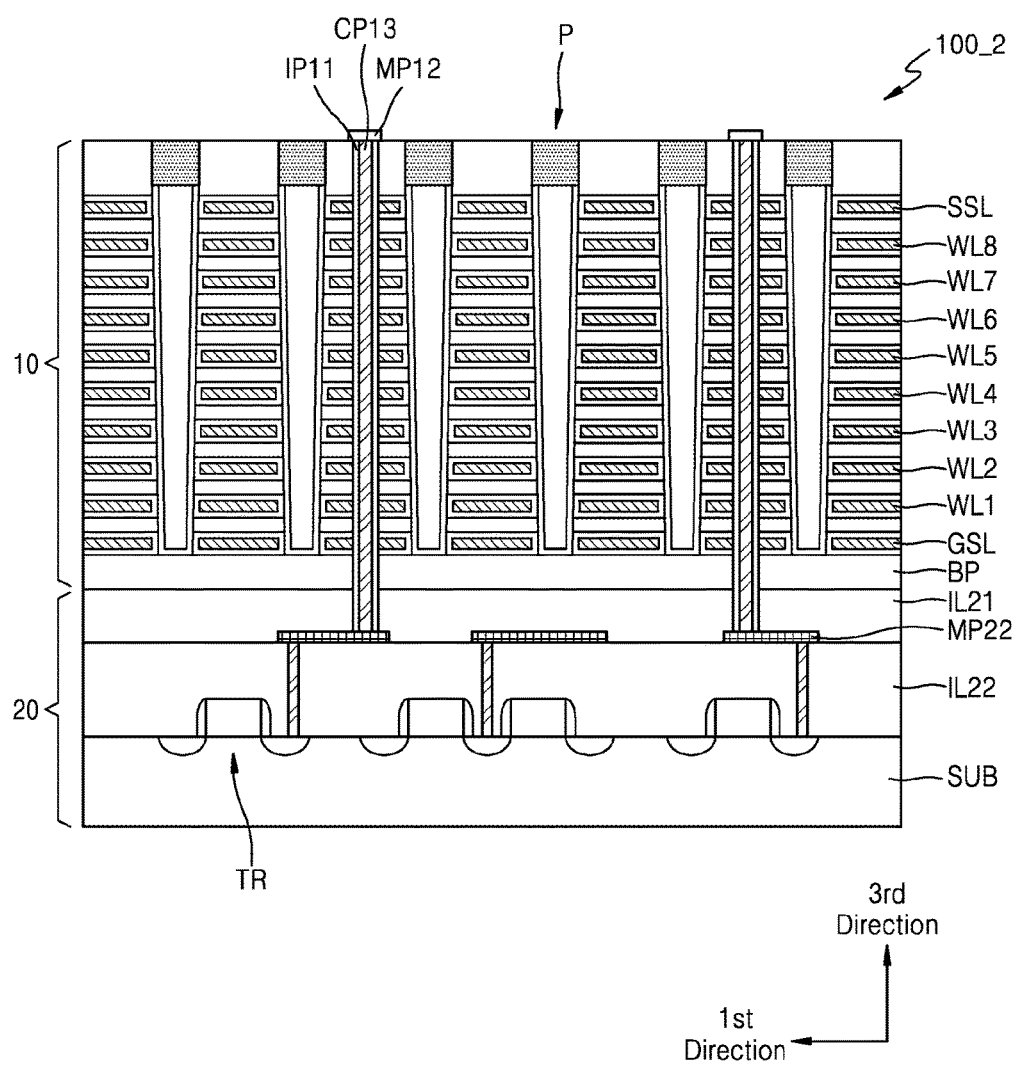
Figure 6C:
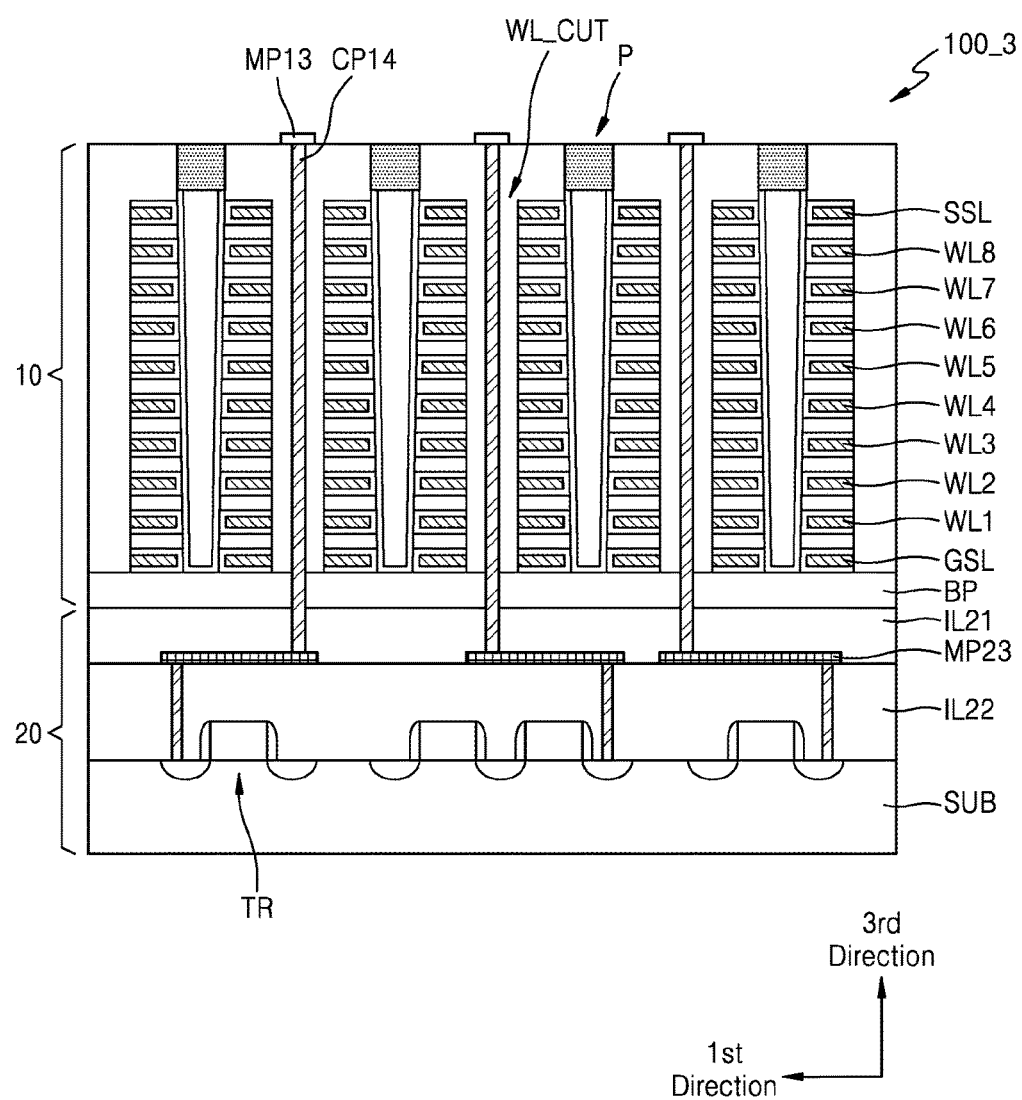

FIGS. 6A to 6C are cross-sectional views of examples of memory devices 100_1 to 100_3 according to example embodiments. In detail, FIG. 6A to 6C illustrate examples of structures to electrically connect the memory cell array 110 formed on the first semiconductor layer 10 of FIG. 2 and the circuits formed in the second semiconductor layer 20. FIGS. 1 and 2 are also referred to in the following description of FIGS. 6A to 6C.

As illustrated in FIGS. 6A to 6C, the second semiconductor layer 20 where the row decoder 120, the page buffer 130, and the peripheral circuit 140 are formed may include the substrate SUB, a second lower insulating layer IL22, and a first lower insulating layer IL21, which are stacked in the third direction. The substrate SUB may be a semiconductor substrate including a semiconductor material such as monocrystalline silicon or monocrystalline germanium, and may be manufactured from a silicon wafer. The first and second lower insulating layers IL21 and IL22 may be formed by using an insulating material such as a silicon oxide through a chemical vapor deposition (CVD) process or a spin coating process.

A plurality of semiconductor devices, for example, transistors TR, may be formed on the substrate SUB of the second semiconductor layer 20. The semiconductor device may be electrically connected to a conductive pattern MP21 formed on the first lower insulating layer IL21 via a contact plug CP21 penetrating through the second lower insulating layer IL22. The semiconductor device formed in the second semiconductor layer 20 may form circuits corresponding to the row decoder 120, the page buffer 130, and the peripheral circuit 140 of FIG. 1.

As illustrated in FIGS. 6A to 6C, the first semiconductor layer 10 where the memory cell array 110 of FIG. 1 is formed may be stacked in the second semiconductor layer 20, and may include the base plate BP and an upper insulating layer IL10, which are stacked in the third direction. In an embodiment, the base plate BP of the first semiconductor layer 10 may be formed by using polysilicon through a sputtering process, a CVD process, an atomic layer deposition (ALD) process, or a physical vapor deposition (PVD) process. In another example embodiment, the base plate BP of the first semiconductor layer 10 may be formed by forming an amorphous silicon layer on the first lower insulating layer IL21 and then changing the amorphous silicon layer to a monocrystalline silicon layer by means of thermal treatment or laser beam irradiation. Accordingly, defects in the base plate BP may be removed. In another example embodiment, the base plate BP maybe formed through a wafer bonding process. In this case, the base plate BP may be formed by attaching a monocrystalline silicon wafer on the first lower insulating layer IL21 and then partially removing or planarizing an upper portion of the monocrystalline silicon wafer.

As described above in FIGS. 4A and 4B, the string selection lines SSL, the word lines WL1 to WL8, and the ground selection line GSL may be stacked on the base plate BP in the third direction, and the pillars P penetrate through the string selection lines SSL, the word lines WL1 to WL8, and the ground selection line GSL, which are stacked, in the first semiconductor layer 10 where the memory cell array 110 is formed.

FIG. 6A is a vertical cross-sectional view of a part of the memory device 100_1 according to an example embodiment, taken in the third direction. Referring to FIG. 6A, a conductive path may be formed between the first semiconductor layer 10 and the second semiconductor layer 20 through a contact plug CP12 disposed at an edge side of the memory cell array 110. In other words, as illustrated in FIG. 6A, the string selection lines SSL, the word lines WL1 to WL8, and the ground selection line GSL, which are stacked in the third direction, may be electrically connected to a conductive pattern MP11 formed on an upper surface of the first semiconductor layer 10 through a contact plug CP11 formed in the upper insulating layer IL10. The conductive pattern MP11 may be electrically connected to the conductive pattern MP21 formed in the second semiconductor layer 20 through the contact plug CP12 penetrating through the first semiconductor layer 10, that is, the upper insulating layer IL10 and the base plate BP. As a result, the conductive pattern MP11 may be electrically connected to the semiconductor device, for example, a transistor TR, formed in the second semiconductor layer 20. For example, as illustrated in FIG. 6A, the contact plug CP12 disposed at the edge side of the memory cell array 110 and penetrating through the first semiconductor layer 10 may be used to electrically connect the word lines WL1-WL8 arranged in the memory cell array 110 to the circuit corresponding to the row decoder 120 formed in the second semiconductor layer 20.

FIG. 6B is a vertical cross-sectional view of a part of the memory device 100_2 according to an example embodiment, taken in the third direction. Referring to FIG. 6B, a conductive path may be formed between the first semiconductor layer 10 and the second semiconductor layer 20 through a contact plug CP13 formed by penetrating through the word lines WL1 to WL8 between the pillars P of the memory cell array 110. As illustrated in FIG. 6B, the contact plug CP13 and an insulating layer pattern IP11 may be formed by penetrating through the string selection lines SSL, the word lines WL1 to WL8, and the ground selection line GSL. The contact plug CP13 penetrating through the first semiconductor layer 10 may electrically connect a conductive pattern MP12 formed on the upper surface of the first semiconductor layer 10 and a conductive pattern MP22 formed in the second semiconductor layer 20. For example, as illustrated in FIG. 6B, the contact plug CP13 disposed between the pillars P of the memory cell array 110 and penetrating through the first semiconductor layer 10 may be used to electrically connect the bit lines arranged in the memory cell array 110 to the circuits corresponding to the page buffer 130 formed in the second semiconductor layer 20.

FIG. 6C is a vertical cross-sectional view of a part of the memory device 100_3 according to an example embodiment, taken in the third direction. Referring to FIG. 6C, a conductive path may be formed between the first semiconductor layer 10 and the second semiconductor layer 20 through a contact plug CP14 formed by penetrating through the word line cut WL_CUT of the memory cell array 110. As illustrated in FIG. 6C, the contact plug CP14 penetrating through the word line cut WL_CUT may electrically connect a conductive pattern MP13 formed on the upper surface of the first semiconductor layer 10 and a conductive pattern MP23 formed in the second semiconductor layer 20. For example, as illustrated in FIG. 6C, the contact plug CP14 penetrating though the word line cut WL_CUT of the memory cell array 110 may be used to connect a power line of the circuit formed on the first semiconductor layer 10 and a power line of the circuit formed in the second semiconductor layer 20.

Figure 7A:
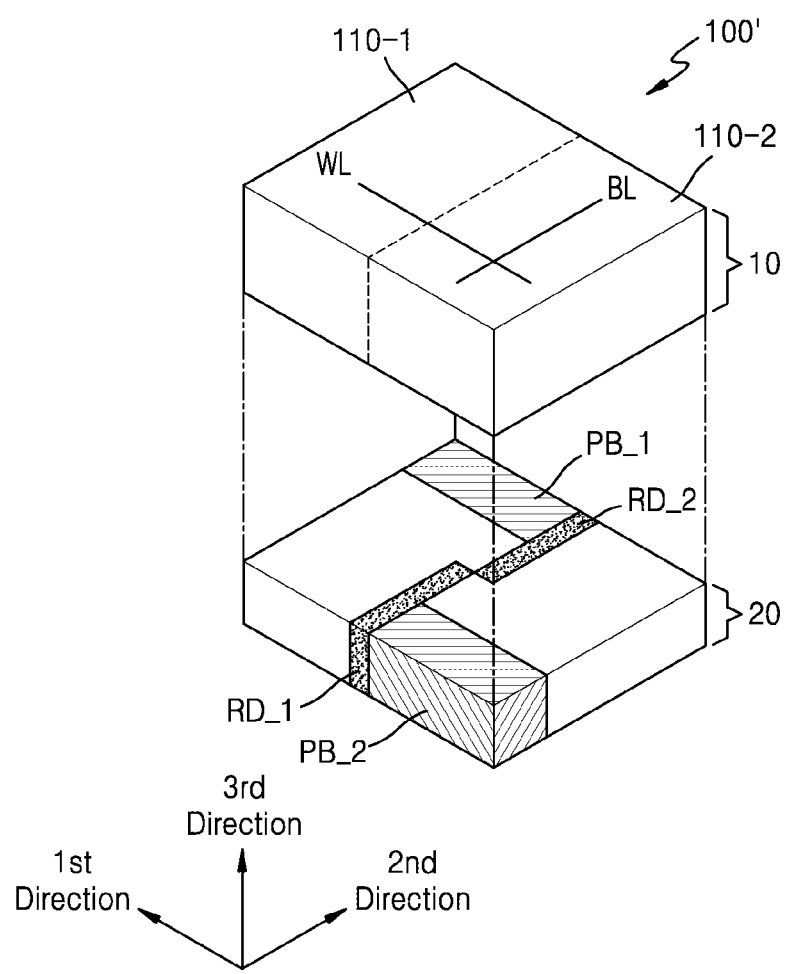
FIG. 7A illustrates a structure of a memory device including first and second semiconductor layers, according to an example embodiment.
Figure 7B:
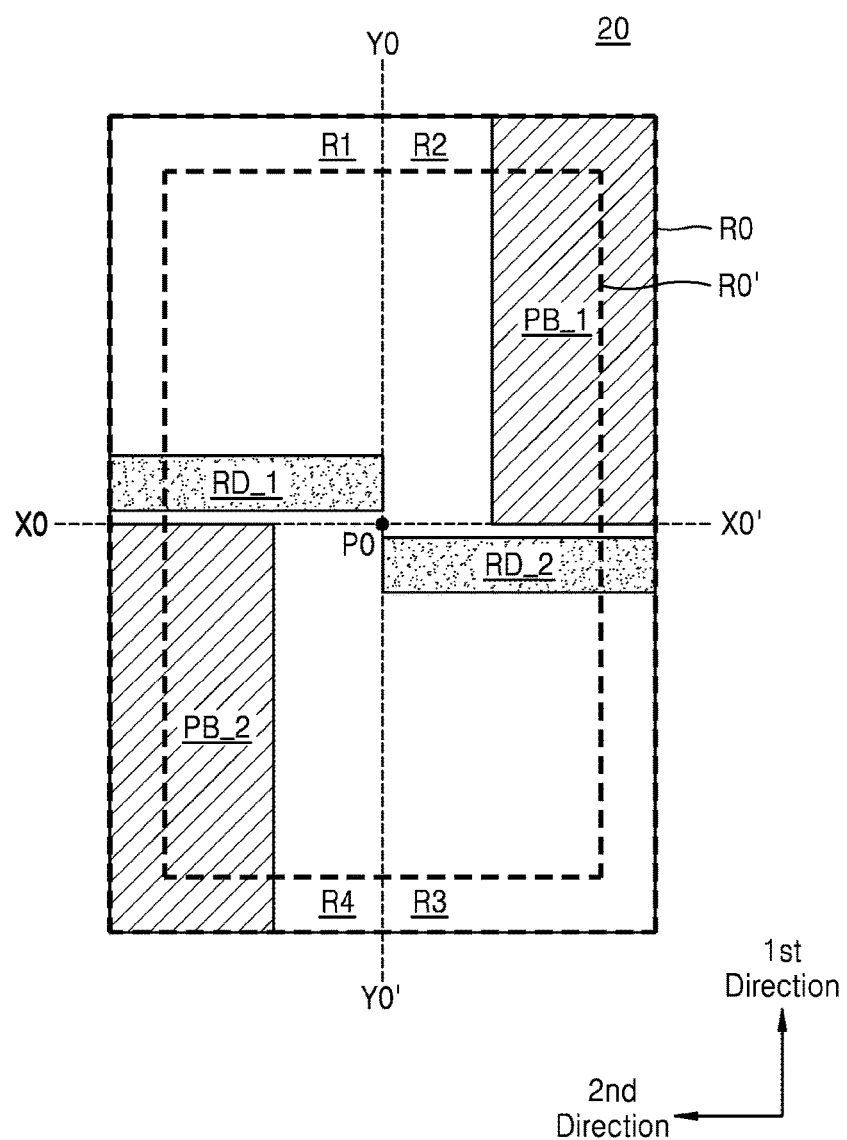
FIG. 7B is a plan view of an upper surface of the second semiconductor layer contacting the first semiconductor layer in the memory device.

FIG. 7A illustrates a structure of a memory device 100 including first and second semiconductor layers 10 and 20, according to an example embodiment. FIG. 7B is a plan view of an upper surface of the second semiconductor layer 20 contacting the first semiconductor layer 10 in the memory device 100'. Although FIG. 7A illustrates the first and second semiconductor layers 10 and 20 to be spaced apart from each other in the third direction for convenience of explanation, as illustrated in FIG. 2, it is understood that a lower surface of the first semiconductor layer 10 and the upper surface of the second semiconductor layer 20 are in contact with each other.

As described above, the row decoder 120 may be disposed to have a shape extending in a direction perpendicular to a direction in which the word lines WL extend, that is, in a direction in which the word lines WL are arranged. The page buffer 130 may be disposed to have a shape extending in a direction perpendicular to the bit lines BL, that is, in a direction in which the bit lines BL are arranged. Accordingly, in the memory device 100' having a COP structure, the row decoder 120 and the page buffer 130 may be disposed like a windmill as each of the row decoder 120 and the page buffer 130 is separated into two or more parts as illustrated in FIGS. 7A and 7B, to increase an area overlapping the memory cell array 110 of the first semiconductor layer 10 in the third direction. In other words, referring to FIGS. 7A and 7B, the circuit corresponding to the row decoder 120 may be separated into first and second row decoder circuits RD_1 and RD_2, and the circuit corresponding to the page buffer 130 may be separated into first and second page buffer circuits PB_1 and PB_2. For example, when the circuit corresponding to the row decoder 120 has substantially the same length as the memory cell array 110 in the second direction and the circuit corresponding to the page buffer 130 has substantially the same length as the memory cell array 110 in the first direction, the circuits corresponding to the row decoder 120 and the page buffer 130 may be disposed like a windmill to overlap the memory cell array 110 of the first semiconductor layer 10 in the third direction. The memory cell array 110 of the first semiconductor layer 10 may include a first sub-array 110-1 and a second sub-array 110-2 as illustrated in FIG. 7A. The first sub-array 110-1 may be controlled by the first row decoder circuit RD_1 and the second sub-array 110-2 may be controlled by the second row decoder circuit RD_2.

Referring to FIG. 7B, when an virtual line Y0-Y0' in the first direction parallel to the word line WL, and an virtual line X0-X0' in the second direction parallel to the bit line BL intersect at a point P0 in a region R0 or R0' overlapping the memory cell array 110 in the third direction perpendicular to the first and second directions, the second semiconductor layer 20 may include four regions R1 to R4 sectioned by the two virtual lines Y0-Y0' and X0-X0'. As illustrated in FIG. 7B, the first and second row decoder circuits RD_1 and RD_2 may be disposed in the first and third regions R1 and R3, respectively, and the first and second page buffer circuits PB_1 and PB_2 may be disposed in the second and fourth regions R2 and R4, respectively. For example, if a region of the second semiconductor layer 20 overlapping the memory cell array 110 of the first semiconductor layer 10 is the region R0 of FIG. 7B, the first to fourth regions R1 to R4 may completely overlap the memory cell array 110. Accordingly, the first and second row decoder circuits RD_1 and RD_2 and the first and second page buffer circuits PB_1 and PB_2 may be completely overlapped with the memory cell array 110 in the third direction. In another example, if a region of the second semiconductor layer 20 overlapping the memory cell array 110 of the first semiconductor layer 10 is the region R0' of FIG. 7B, the first to fourth regions R1 to R4 may partially overlap the memory cell array 110. Accordingly, the first and second row decoder circuits RD_1 and RD_2 and the first and second page buffer circuits PB_1 and PB_2 may include a portion that does not overlap the memory cell array 110 in the third direction.

In FIG. 7B, the first to fourth regions R1 to R4 may have substantially the same area. In other words, the first and second row decoder circuits RD_1 and RD_2 may have the same area, and the first and second page buffer circuits PB_1 and PB_2 may have the same area. Also, the first and second row decoder circuits RD_1 and RD_2 may be symmetrically disposed with respect to the point P0, and the first and second page buffer circuits PB_1 and PB_2 may also be symmetrically disposed with respect to the point P0.

The peripheral circuit 140 of FIG. 1 may be disposed in a region in the second semiconductor layer 20, where the circuits RD_1, RD_2, PB_1, and PB_2 are not disposed. As illustrated in FIG. 7B, the region of the second semiconductor layer 20, where the peripheral circuit 140 is to be disposed, may be restricted. For example, a circuit included in the peripheral circuit 140, which needs to be disposed in a relatively large and continuous region, may have a portion that does not overlap the memory cell array 110. Accordingly, the area occupied by the memory device 100 of FIG. 7A on a plane perpendicular to the third direction may be increased, and as a result, the number of the memory devices 100' to be manufactured from one wafer may be deceased. In the following description, examples of memory devices according to example embodiments, in which the peripheral circuit 140 is disposed in the second semiconductor layer 20, are described in detail with reference to FIG. 8 to FIG. 17.

Figure 8:
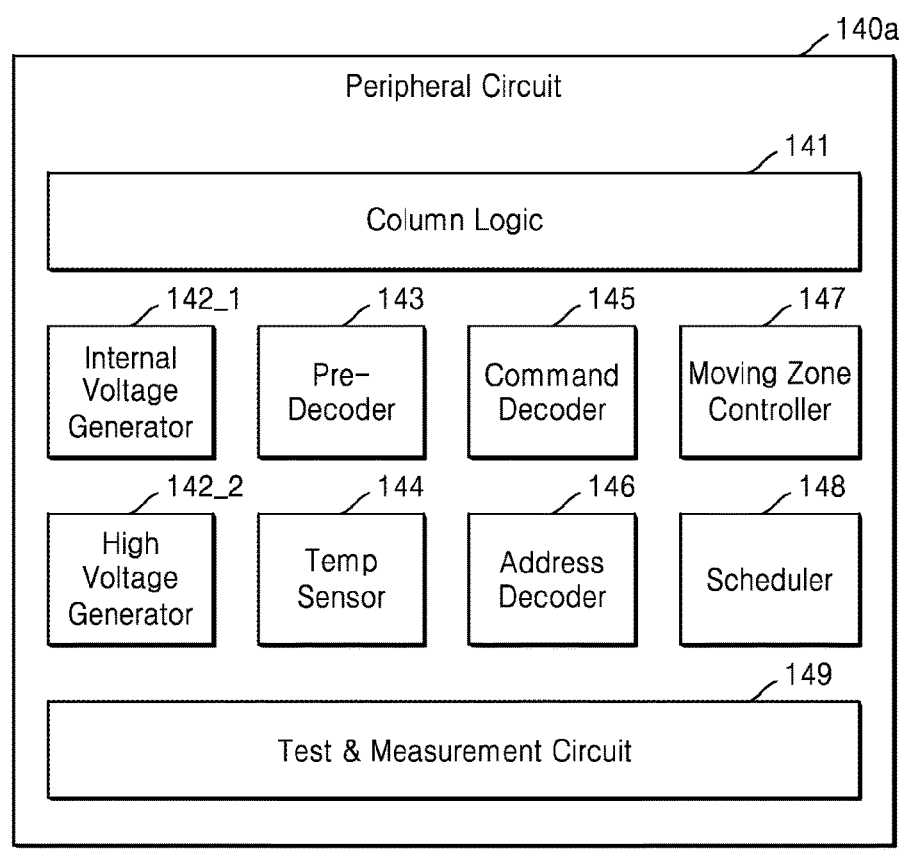
FIG. 8 is a block diagram of a peripheral circuit according to an example embodiment.

FIG. 8 is a block diagram of a peripheral circuit 140a according to an example embodiment. As described in FIGS. 1 and 2, the peripheral circuit 140a may include circuits excluding the memory cell array 110, the row decoder 120, and the page buffer 130 from the memory device 100. As illustrated in FIG. 8, the peripheral circuit 140a may include a column logic 141, an internal voltage generator 142_1, a high voltage generator 142_2, a pre-decoder 143, a temperature sensor 144, a command decoder 145, an address decoder 146, a moving zone controller 147, a scheduler 148, and a test and measurement circuit 149. The elements of the peripheral circuit 140a illustrated in FIG. 8 are mere examples and the peripheral circuit 140a according to an example embodiment may further include other elements that are not illustrated in FIG. 8 and other elements that are different from those illustrated in FIG. 8. In the following description, the peripheral circuit 140a of FIG. 8 is described with reference to FIG. 1.

The column logic 141 may generate a signal to drive the page buffer 130, for example, the page buffer control signal C_PB of FIG. 1. The pre-decoder 143 may generate a signal to drive the row decoder 120, for example, a signal to determine the timing of a signal output by the row decoder 120. The internal voltage generator 142_1 may generate voltages used inside the memory device 100, for example, voltages applied to the word line and the bit line, reference voltages, and power voltages. The high voltage generator 142_2 may include a charge pump, a regulator, etc., and may generate high voltages used to program or erase memory cells of the memory cell array 110. The temperature sensor 144 may sense a temperature of the memory device 100 and output a signal corresponding to a sensed temperature.

The command decoder 145 may latch and decode the command signal CMD received from the outside of the memory device 100, and set an operation mode of a memory device according to a decoded command. The address decoder 146 may latch and decode the address signal ADDR received from the memory device 100, and activate a memory block selected according to a decoded address. The moving zone controller 147 may control an operation of applying various voltages to strings included in the memory cell array 110. The scheduler 148 may include a processor or a state machine and generate a plurality of control signals at an appropriate timing according to a mode set by a command.

The test and measurement circuit 149 may test or measure properties of the memory device 100 in a purpose of providing information to identify the properties of the memory device 100 in a manufacturing process of the memory device 100. Also, the test and measurement circuit 149 may operate in response to the command signal CMD received from the outside of the memory device 100. A system including the memory device 100 may use the test and measurement circuit 149 to obtain the information about the properties of the memory device 100 at the initial stage of operation.

The circuits corresponding to the elements of the peripheral circuit 140*a* of FIG. 8 may be disposed in the second semiconductor layer 20 of FIG. 2 or FIG. 7A, with the row decoder 120 and the page buffer 130 of FIG. 1.

FIGS. 9A to 9D illustrate examples of the second semiconductor layer 20 of FIG. 7A, according to example embodiments. In detail, FIGS. 9A to 9D schematically illustrate upper surfaces of second semiconductor layers 20*a*, 20*b*, 20*c*, and 20*d*. As described above in FIGS. 7A and 7B, the upper surface of the second semiconductor layer 20 may contact the lower surface of the first semiconductor layer 10. The first and second row decoder circuits RD_1 and RD_2 may be disposed in the first and third regions R1 and R3, respectively. The first and second page buffer circuits PB_1 and PB_2 may be disposed in the second and fourth regions R2 and R4, respectively. A second semiconductor layer 20*a* of FIG. 9A may be sectioned by virtual lines Y1-Y1' and X1-X1' intersecting at a point P1 into first to fourth regions R1*a* to R4*a*. A second semiconductor layer 20*b* of FIG. 9B may be sectioned by virtual lines Y2-Y2' and X2-X2' intersecting at a point P2 into first to fourth regions R1*b* to R4*b*. A second semiconductor layer 20*c* of FIG. 9C may be sectioned by virtual lines Y3-Y3' and X3-X3' intersecting at a point P3 into first to fourth regions R1*c* to R4*c*. A second semiconductor layer 20*d* of FIG. 9D may be sectioned by virtual lines Y4-Y4' and X4-X4' intersecting at a point P4 into first to fourth regions R1*d* to R4*d*.

Figure 9A:
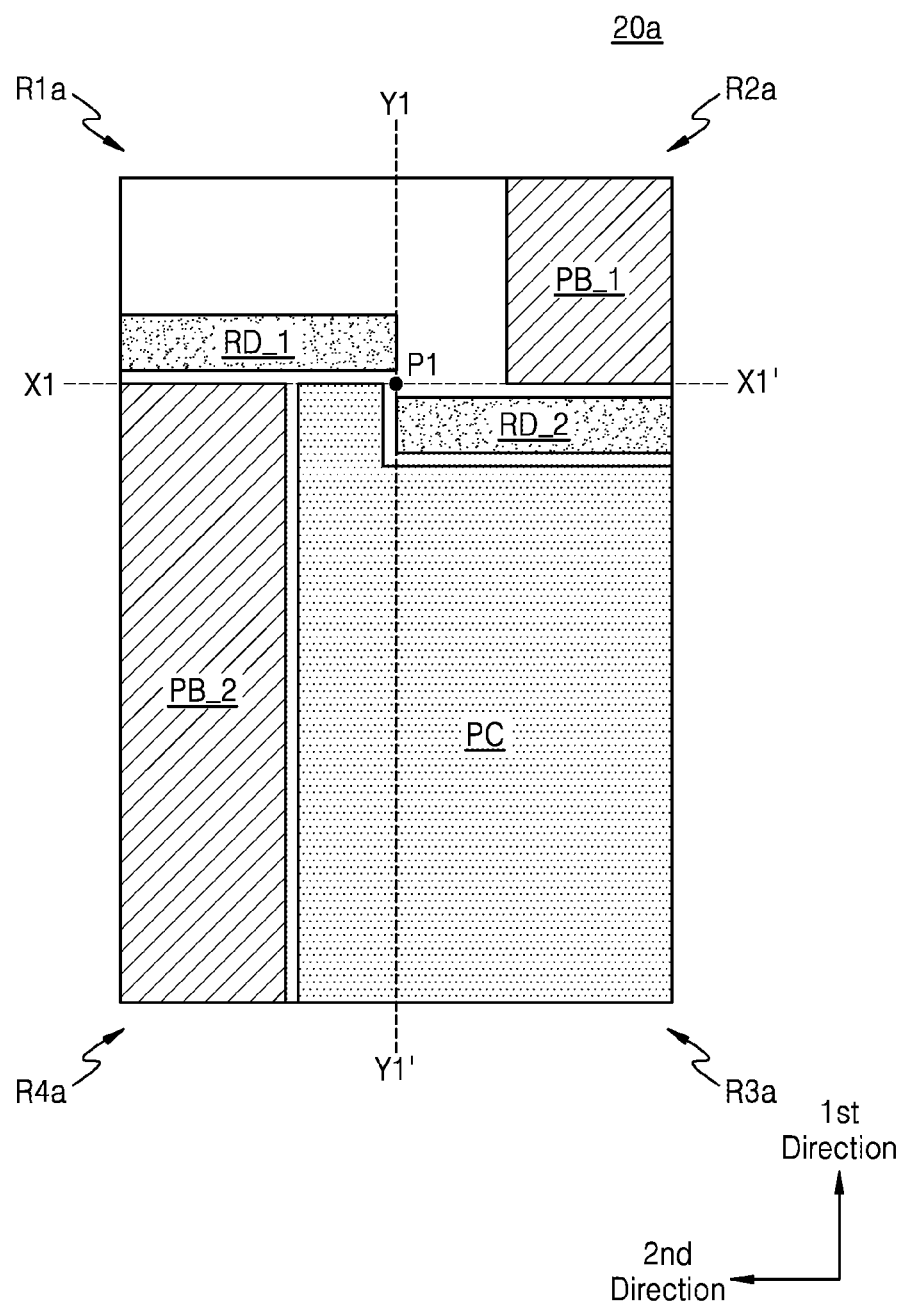
FIGS. 9A to 9D illustrate examples of the second semiconductor layer of FIG. 7A, according to example embodiments.
Figure 9B:
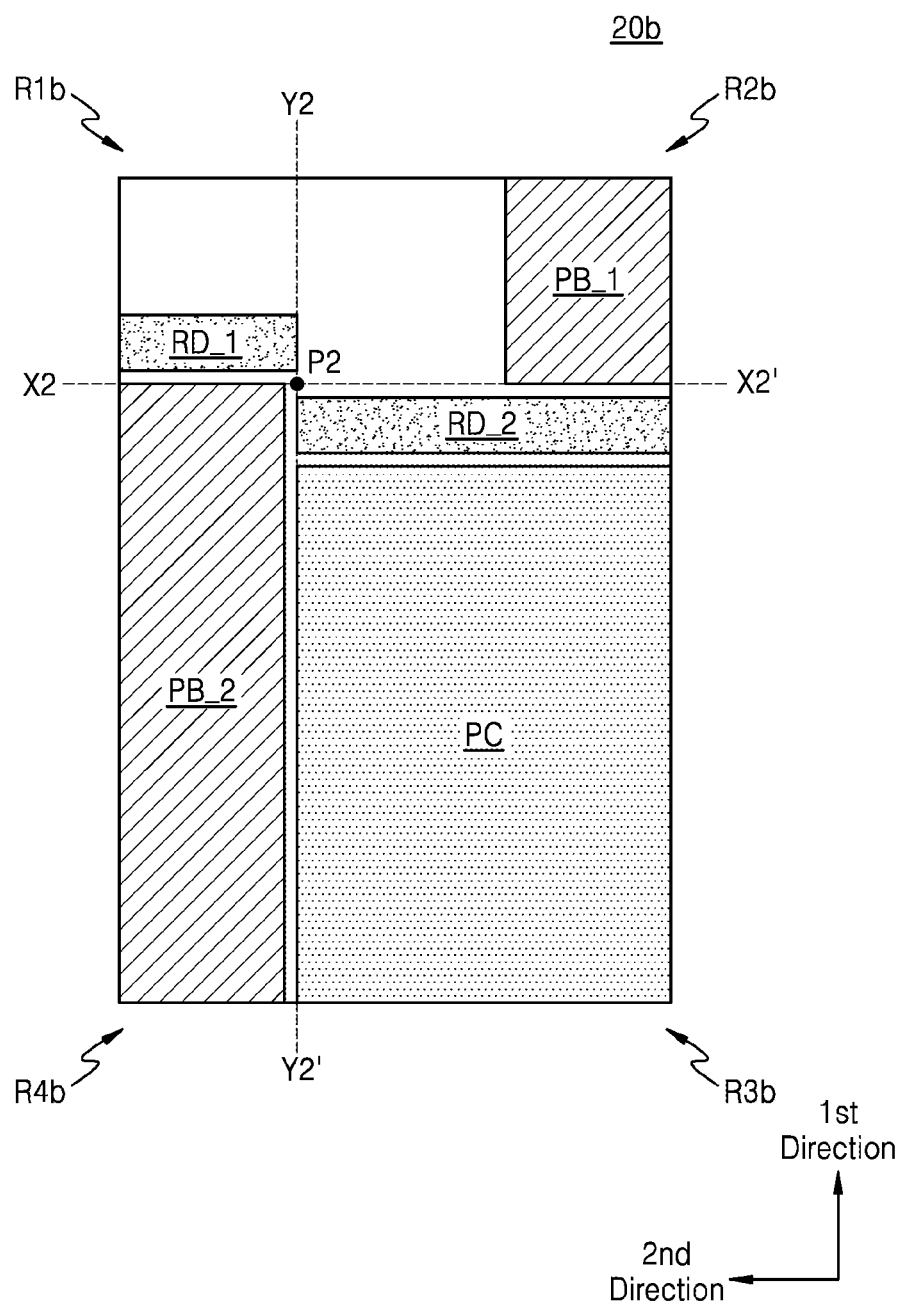

Referring to FIGS. 9A to 9D, according to example embodiments, the first and second row decoder circuits RD_1 and RD_2 may be asymmetrically disposed and/or the first and second page buffer circuits PB_1 and PB_2 may be asymmetrically disposed. For example, as illustrated in FIG. 9A, the areas of the first and third regions R1*a* and R3*a* where the first and second row decoder circuits RD_1 and RD_2 are respectively disposed may be different from each other, and/or the areas of the second and fourth regions R2*a* and R4*a* where the first and second page buffer circuits PB_1 and PB_2 are respectively disposed may be different from each other. In other words, the areas of the first and second page buffer circuits PB_1 and PB_2 may be different from each other. Also, as illustrated in FIG. 9B, the areas of the first and third regions R1*b* and R3*b* where the first and second row decoder circuits RD_1 and RD_2 are respectively disposed may be different from each other, and the areas of the first and second row decoder circuits RD_1 and RD_2 may be different from each other.

Referring to FIG. 9A, a relatively large and continuous region to arrange the peripheral circuit 140 of FIG. 1 may be secured, and a peripheral circuit PC may be continuously disposed in one or more of the first and fourth regions R1*a* to R4*a*, for example, the third and fourth regions R3*a* and R4*a*. Also, Referring to FIG. 9B, as the first and second row decoder circuits RD_1 and RD_2 are asymmetrically disposed and the first and second page buffer circuits PB_1 and PB_2 are asymmetrically disposed, the peripheral circuit PC may be disposed in one of the first to fourth regions R1*b* to R4*b*, for example, in the third region R3*b*. In other words, the first to fourth regions R1*b* to R4*b* may be sectioned considering the disposition of the peripheral circuit PC, and the circuits RD_1, PB_1, RD_2, and PB_2 may be respectively disposed in the sectioned first to fourth regions R1*b* to R4*b*. For example, when the first to fourth regions R1*a* to R4*a* of FIG. 9A are completely overlapped with the memory cell array 110, the first to fourth regions R1*a* to R4*a* may be sectioned such that the peripheral circuit PC is completely overlapped with the memory cell array 110. The first to fourth regions (e.g., R1*a* to R4*a* of FIG. 9A) may define a plane region that includes the first to fourth regions.

Figure 9C:
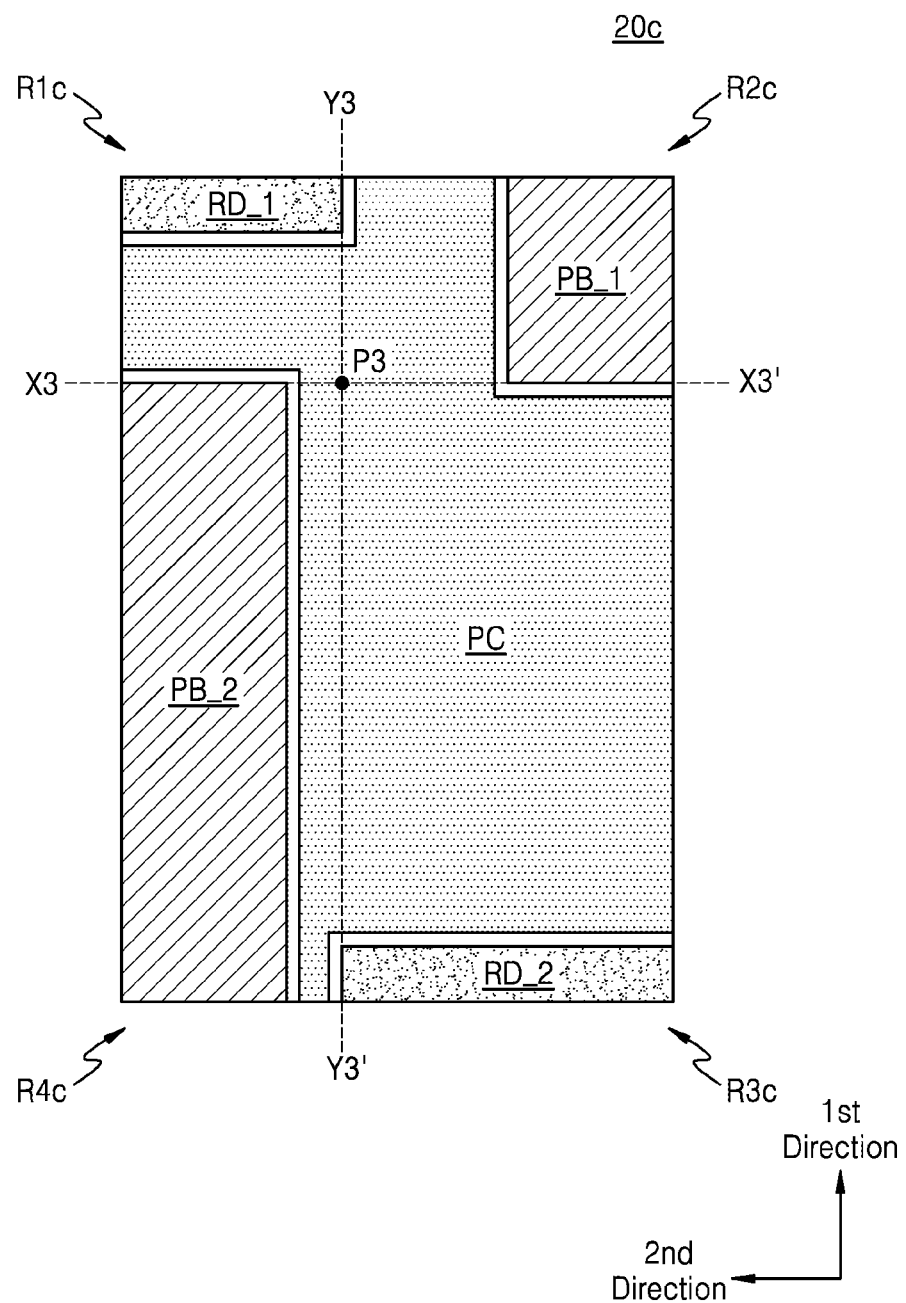
Figure 9D:
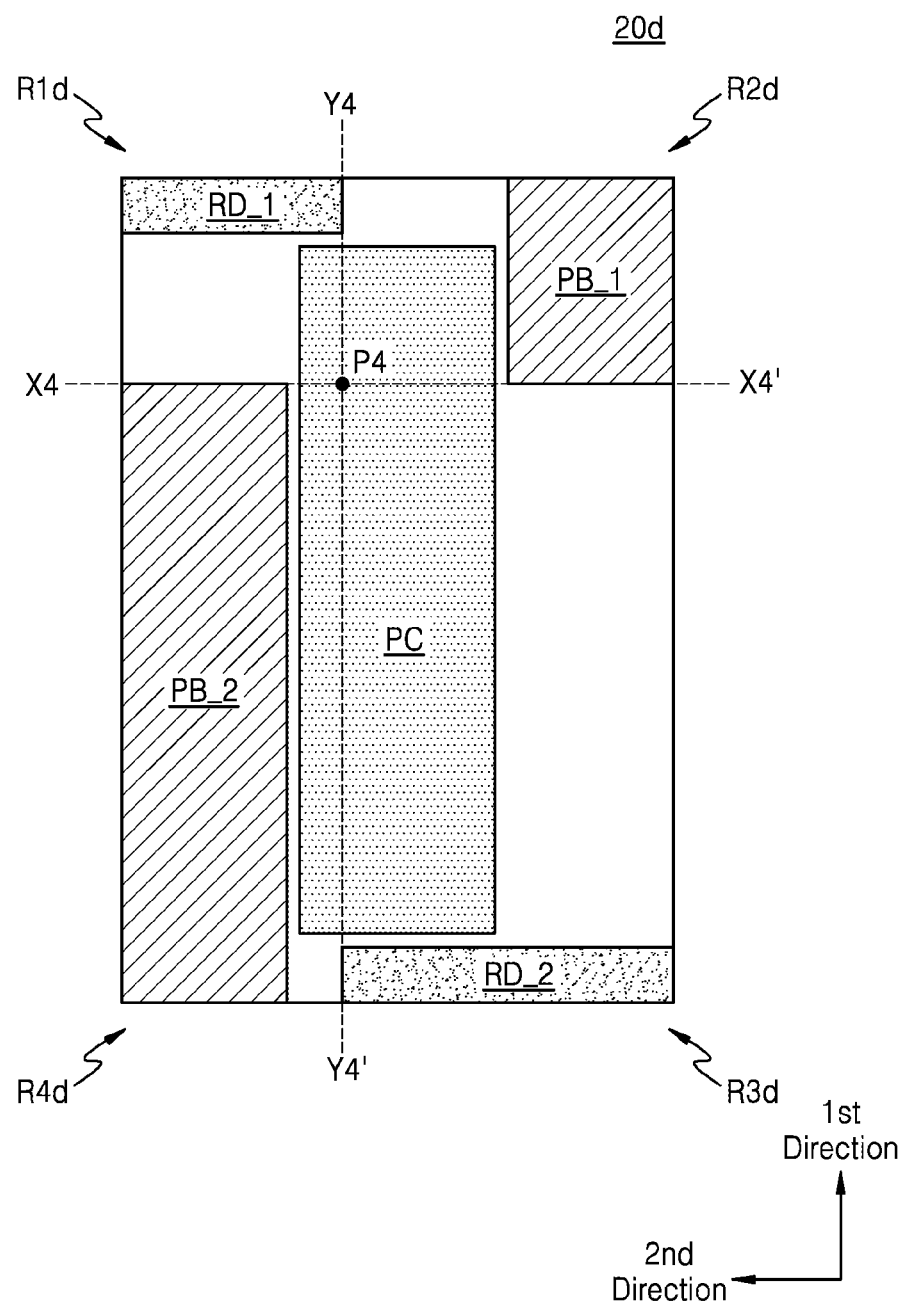

According to an example embodiment, the first and second row decoder circuits RD_1 and RD_2 may be disposed to be spaced apart from each other as far as possible or to be close to each other. Also, the first and second page buffer circuits PB_1 and PB_2 may be disposed to be spaced apart from each other as far as possible or to be close to each other. For example, as illustrated in FIGS. 9A and 9B, the first and second row decoder circuits RD_1 and RD_2 may be close to each other, that is, close to the point P2 or the point P3, or as illustrated in FIGS. 9C and 9D, the first and second row decoder circuits RD_1 and RD_2 may be spaced apart from each other as far as possible. Although FIGS. 9A to 9D illustrate that the first and second page buffer circuits PB_1 and PB_2 are disposed to be spaced apart from each other as far as possible, according to an example embodiment, the first and second page buffer circuits PB_1 and PB_2 may be disposed close to each other. In other words, the first and second row decoder circuits RD_1 and RD_2 and the first and second page buffer circuits PB_1 and PB_2 may be disposed in the first to fourth regions to provide a region for the peripheral circuit PC.

Referring to FIGS. 9C and 9D, when each of the first and second row decoder circuits RD_1 and RD_2 and the first and second page buffer circuits PB_1 and PB_2 is disposed to be spaced apart from each other as far as possible, the peripheral circuit PC may be disposed in an area where the first and second row decoder circuits RD_1 and RD_2 and the first and second page buffer circuits PB_1 and PB_2 are not disposed. For example, as illustrated in FIG. 9C, the peripheral circuit PC may be disposed in an entire area of the second semiconductor layer 20*c* where the first and second row decoder circuits RD_1 and RD_2 and the first and second page buffer circuits PB_1 and PB_2 are not disposed. Also, as illustrated in FIG. 9D, the peripheral circuit PC may be disposed in a partial area of the second semiconductor layer 20*d* where the first and second row decoder circuits RD_1 and RD_2 and the first and second page buffer circuits PB_1 and PB_2 are not disposed.

The first and second page buffer circuits PB_1 and PB_2 having different areas may include a different number of semiconductor devices. For example, as illustrated in FIG. 9A, when the second page buffer circuit PB_2 disposed in the fourth region R4*a* has an area larger than the first page buffer circuit PB_1 disposed in the second region R2*a*, the second page buffer circuit PB_2 may include more semiconductor devices than the first page buffer circuit PB_1. In other words, the number of the bit lines electrically connected to the second page buffer circuit PB_2 may be greater than the number of the bit lines electrically connected to the first page buffer circuit PB_1.

For example, when the size of one page of the memory cell array 110 is 16 KB, the first page buffer circuit PB_1 of the second region R2a may process 4 KB data, whereas the second page buffer circuit PB_2 of the fourth region R4a may process 12 KB data.

Similar to the first and second page buffer circuits PB_1 and PB_2, the first and second row decoder circuits RD_1 and RD_2 having different areas may include different numbers of semiconductor devices, respectively. For example, as illustrated in FIG. 9B, when the first row decoder circuit RD_1 disposed in the first region R1b has an area smaller than the second row decoder circuit RD_2 disposed in the third region R3b, the first row decoder circuit RD_1 may include less semiconductor devices than the second row decoder circuit RD_2. In other words, the number of the word lines electrically connected to the first row decoder circuit RD_1 may be less than that of the word lines electrically connected to the second row decoder circuit RD_2.

Figure 10A:
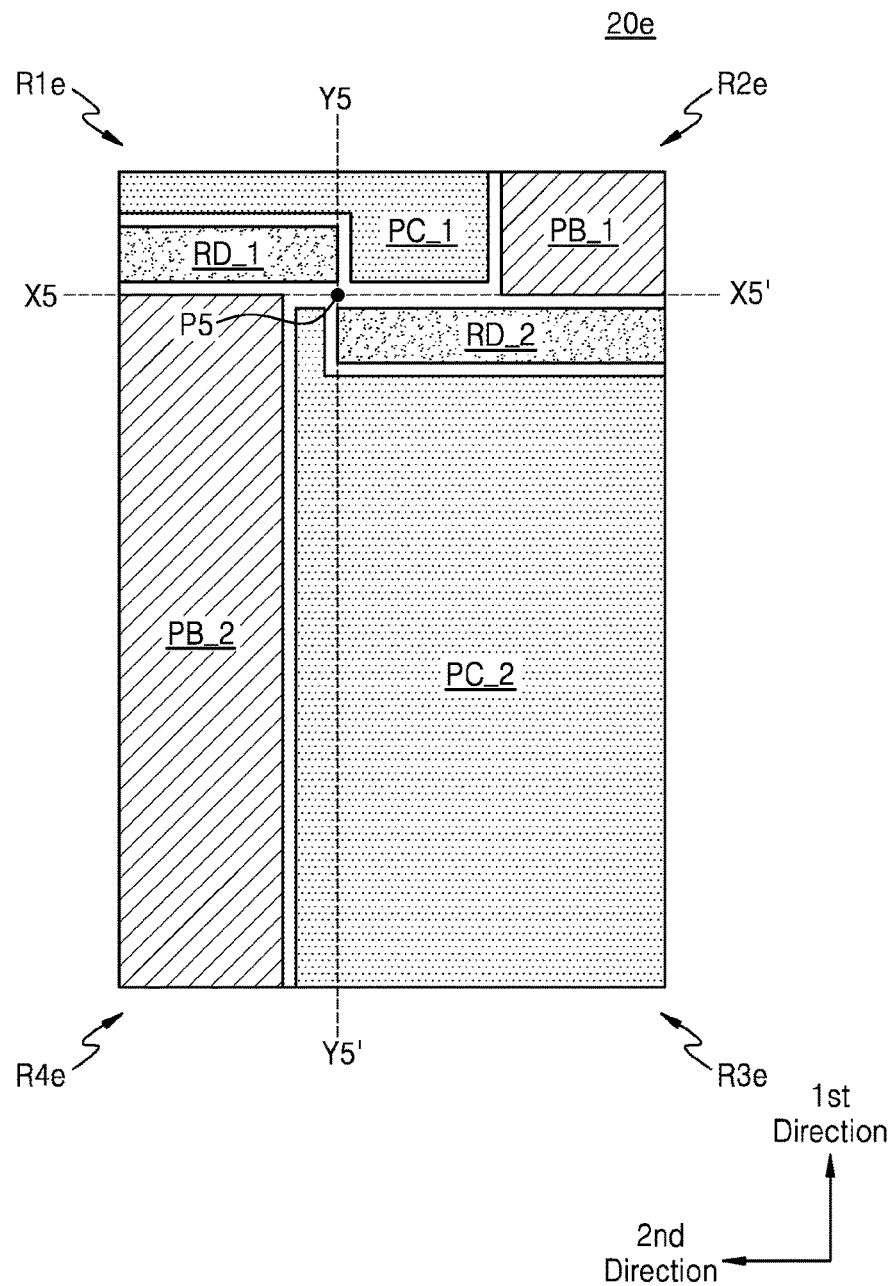
FIGS. 10A to 10C illustrate examples of the second semiconductor layer of FIG. 7A, according to example embodiments.
Figure 10B:
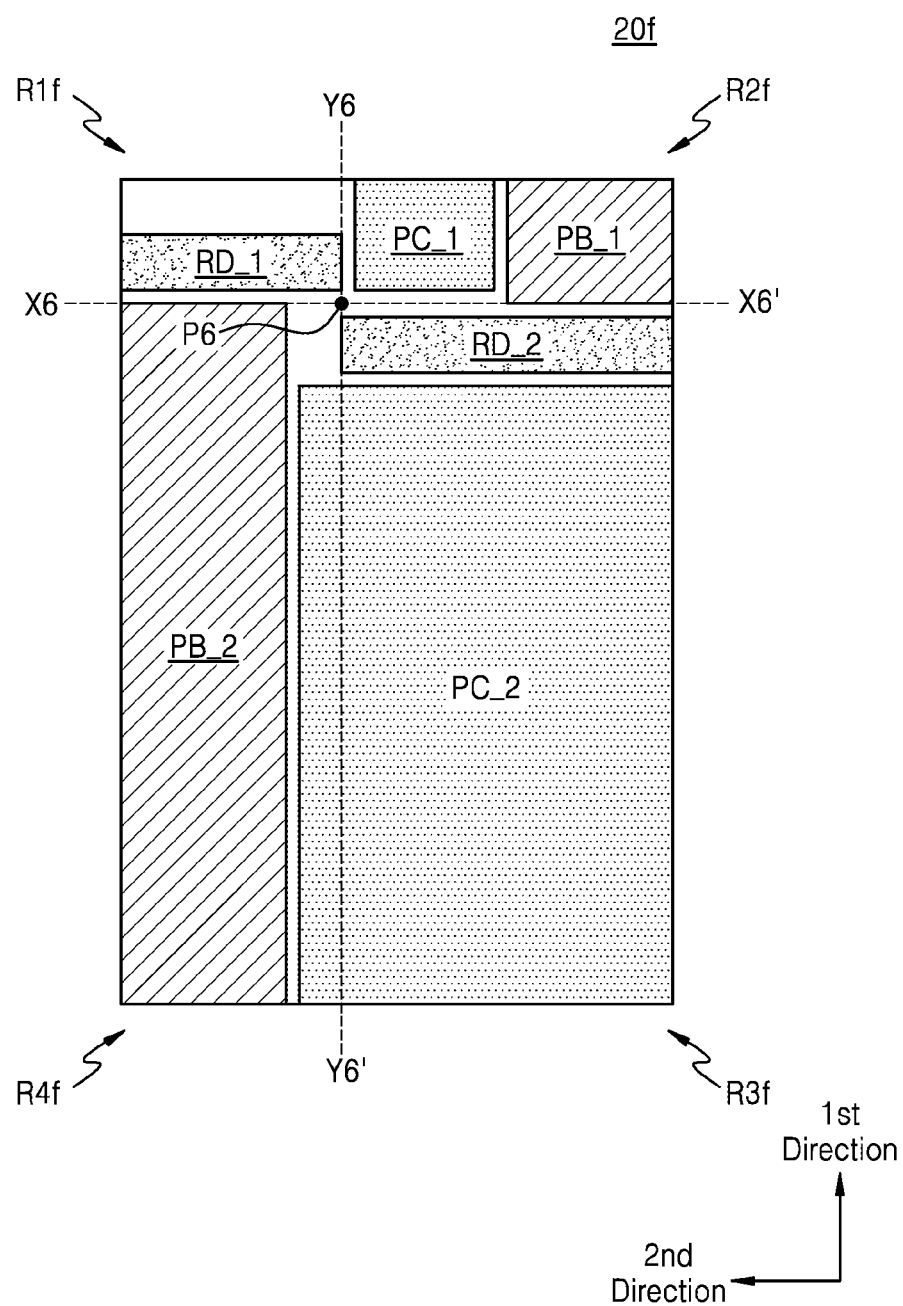
Figure 10C:
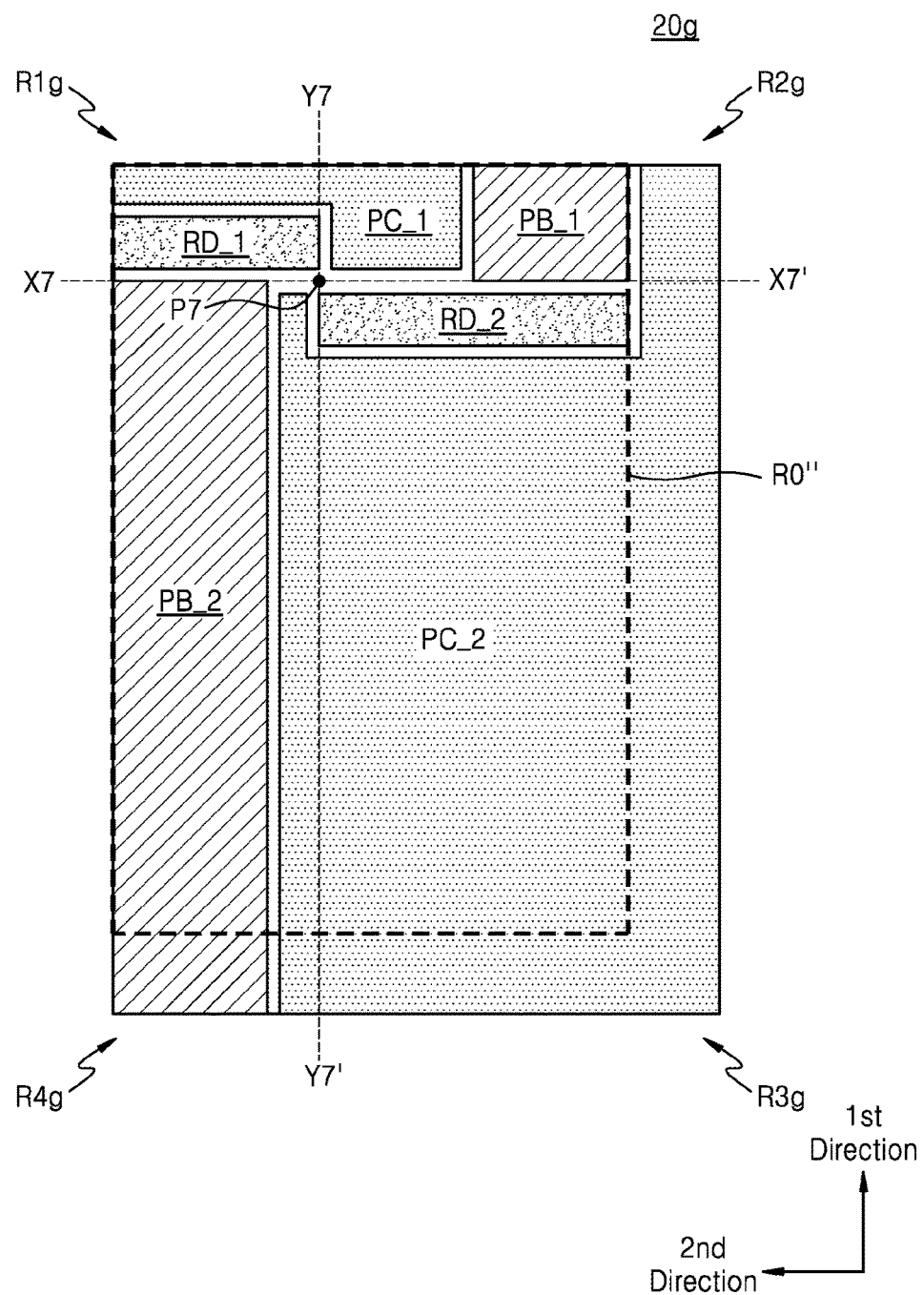

FIGS. 10A to 10C illustrate examples of the second semiconductor layer 20 of FIG. 7A, according to example embodiments. In detail, like FIGS. 9A to 9D, FIGS. 10A to 10C schematically illustrate upper surfaces of second semiconductor layers 20e, 20f, and 20g, respectively. The second semiconductor layer 20e of FIG. 10A may be sectioned by virtual lines Y5-Y5' and X5-X5' into first to fourth regions R1e to R4e. The second semiconductor layer 20f of FIG. 10B may be sectioned by virtual lines Y6-Y6' and X6-X6' into first to fourth regions R1f to R4f. The second semiconductor layer 20g of FIG. 10C may be sectioned by virtual lines Y7-Y7' and X7-X7' into first to fourth regions R1g to R4g.

According to an example embodiment, the peripheral circuit 140 of FIG. 1 may be sectioned and disposed in each of the second semiconductor layers 20e, 20f, and 20g. In other words, the peripheral circuit 140 may include a plurality of sub-circuits corresponding to one or more of the elements of the peripheral circuit 140a of FIG. 8. The sub-circuits may be separately disposed in at least two of first to fourth regions of each of the second semiconductor layers 20e, 20f, and 20g.

Referring to FIG. 10A, the peripheral circuit 140 may include the first and second sub-circuits PC_1 and PC_2 that may be separately disposed over the second semiconductor layer 20e. In other words, the first sub-circuit PC_1 may be disposed in an entire area of the first and second regions R1e and R2e, except for an area where the first row decoder circuit RD_1 and the first page buffer PB_1 are disposed. The second sub-circuit PC_2 may be disposed in an entire area of the third and fourth regions R3e and R4e, except for an area where the second row decoder RD_2 and the second page buffer PB_2 are disposed.

Referring to FIG. 10B, unlike the example of FIG. 10A, the first sub-circuit PC_1 may be disposed in a partial area of the first and second regions R1f and R2f, except for an area where the first row decoder circuit RD_1 and the first page buffer PB_1 are disposed. The second sub-circuit PC_2 may be disposed in a partial area of the third and fourth regions R3f and R4f, except for an area where the second row decoder RD_2 and the second page buffer PB_2 are disposed.

Referring to FIG. 10C, at least one of the first and second row decoder circuits RD_1 and RD_2 and the first and second page buffer circuits PB_1 and PB_2 may include a portion that does not overlap the memory cell array 110 of the first semiconductor layer 10. In other words, at least one of the first and second row decoder circuits RD_1 and RD_2 and the first and second page buffer circuits PB_1 and PB_2 may include a portion that is not disposed in a region R0" of the second semiconductor layer 20g that is overlapped with the memory cell array 110 of the first semiconductor layer 10. For example, as illustrated in FIG. 10C, the second page buffer PB_2 may include a portion that is not disposed in the region R0". Also, at least one of the first and second sub-circuits PC_1 and PC_2 may include a portion that is not disposed in the region R0" of the second semiconductor layer 20g that does overlap the memory cell array 110 of the first semiconductor layer 10. For example, as illustrated in FIG. 10C, the second sub-circuit PC_2 may include a portion that is not disposed in the region R0".

According to example embodiments, elements of the peripheral circuit 140 included in the first and second sub-circuits PC_1 and PC_2 may be arranged in various ways. For example, the first and second sub-circuits PC_1 and PC_2 may include circuits configured to perform different functions, circuits configured to perform the same function, or the same circuits. As the sub-circuits of the peripheral circuit 140 are separately disposed in the regions where the first and second row decoder circuits RD_1 and RD_2 and the first and second page buffer circuits PB_1 and PB_2 are disposed, a portion of the peripheral circuit 140, which has been disposed in an area, not overlapping the memory cell array 110, of each of the second semiconductor layers 20e, 20f, and 20g, may be removed or reduced.

Figure 11:
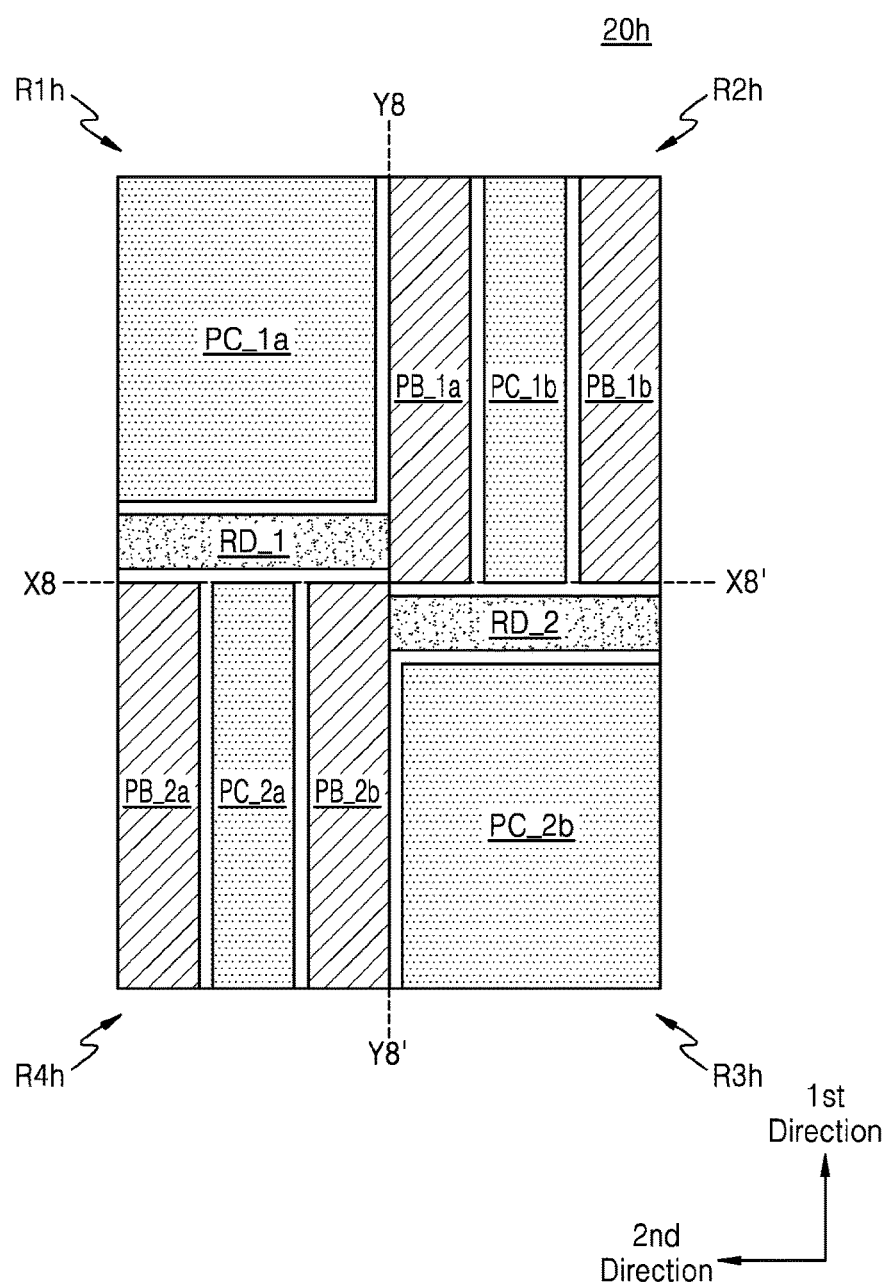
FIG. 11 illustrates an example of the second semiconductor layer of FIG. 7A, according to an example embodiment.

FIG. 11 illustrates an example of the second semiconductor layer 20 of FIG. 7A, according to an example embodiment. A second semiconductor layer 20h of FIG. 11 may be sectioned by virtual lines Y8-Y8' and X8-X8' into first to fourth regions R1h to R4h. Referring to FIG. 11, according to an example embodiment, a row decoder circuit or a page buffer circuit that is disposed in one of the first to fourth regions R1h to R4h may be separately disposed. For example, as illustrated in FIG. 11, page buffer sub-circuits PB_1a and PB_1b may be separately disposed in the second region R2h of the second semiconductor layer 20h, and page buffer sub-circuits PB_2a and PB_2b may be separately disposed in the fourth region R4h of the second semiconductor layer 20h.

The row decoder circuits or page buffer circuits that are separately disposed in one region may control different areas of the memory cell array 110. For example, the memory cell array 110 formed in the first semiconductor layer 10 of FIG. 7A may include a first sub-array 110-1 that overlaps the first and fourth regions R1h and R4h of FIG. 11, and a second sub-array 110-2 that overlaps the second and third regions R2h and R3h. Among the page buffer sub-circuits PB_1a and PB_1b included in the second region R2h, the page buffer sub-circuit PB_1a that is disposed adjacent to the first region R1h may be configured to control the first sub-array of the memory cell array 110 that overlaps the first and fourth regions R1h and R4h. The other page buffer sub-circuit PB_1b of the second region R2h may be configured to control the second sub-array of the memory cell array 110 that overlaps the second and third regions R2h and R3h. Similarly, among the page buffer sub-circuits PB_2a and PB_2b included in the fourth region R4h, the page buffer sub-circuit PB_2b disposed adjacent to the third region R3h may be configured to control the second sub-array and the other page buffer sub-circuit PB_2a of the fourth region R4h may be configured to control the first sub-array. As illustrated in FIG. 11, the sub-circuits PC_1a, PC_1b, PC_2a, and PC_2b forming the peripheral circuit 140 of FIG. 1 may be disposed in areas where the row decoder circuits RD_1 and RD_2 and the page buffer sub-circuits PB_1a, PB_1b, PB_2a, and PB_2b are not disposed.

Figure 12:
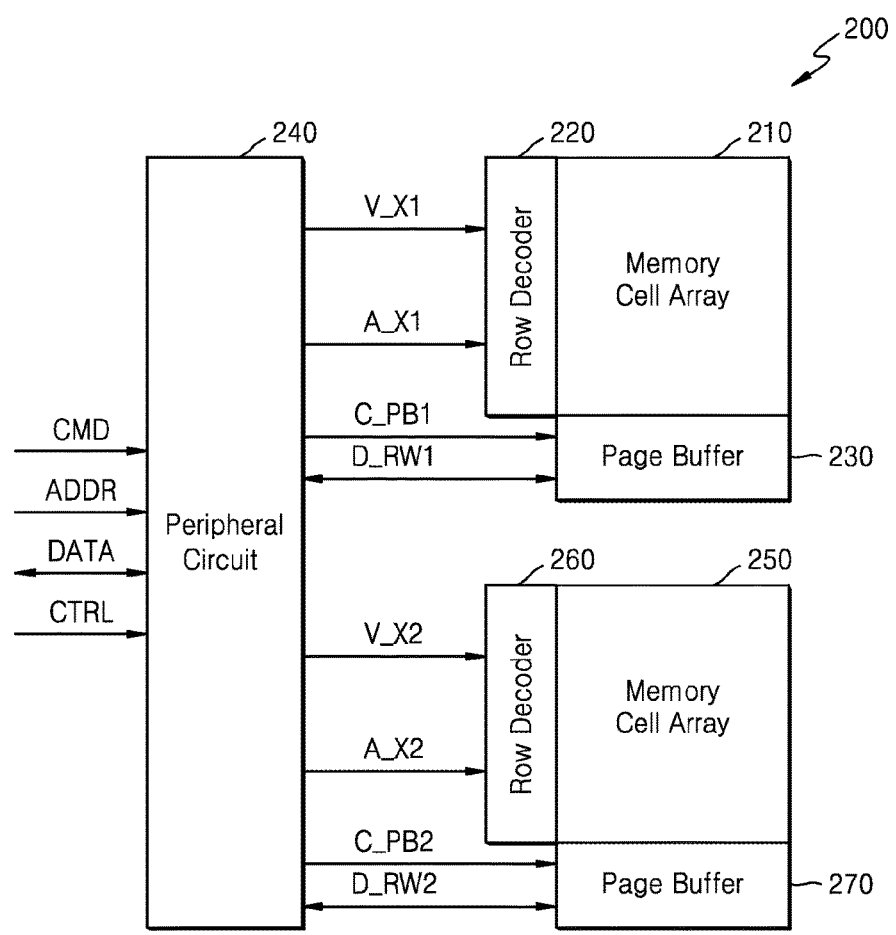
FIG. 12 is a block diagram of a memory device according to another example embodiment.

FIG. 12 is a block diagram of a memory device 200 according to another example embodiment. Compared with the memory device 100 of FIG. 1, the memory device 200 of FIG. 12 may include a plurality of memory cell arrays 210 and 250, a plurality of row decoders 220 and 260 corresponding to the memory cell arrays 210 and 250, and a plurality of page buffers 230 and 270. A peripheral circuit 240 may denote elements included in the memory device 200, except for the memory cell arrays 210 and 250, the row decoders 220 and 260, and the page buffers 230 and 270.

Referring to FIG. 12, the memory device 200 may include the memory cell arrays 210 and 250 that are independently controlled. In each of the memory cell arrays 210 and 250, a plurality of word lines may be independently activated by the row decoders 220 and 260 and an operation, for example, a write operation and a read operation, may be independently controlled through the page buffers 230 and 270. As such, in the memory device 200, a unit of a memory cell array that is independently controlled to perform a particular operation in parallel or to perform different operations may be referred to as a plane. In the example of FIG. 12, the memory cell array 210 and the memory cell array 250 may be referred to be included in different planes.

Referring to FIG. 12, while the peripheral circuit 240 receives the command signal CMD, the address signal ADDR, the control signal CTRL, and the data DATA from the outside of the memory device 200, the peripheral circuit 240 may generate signals corresponding to a plane. In other words, the peripheral circuit 240 may generate a first drive voltage V_X1, a first row address A_X1, and a first page buffer control signal C_PB1 for the memory cell array 210, and a second drive voltage V_X2, a second row address A_X2, and a second page buffer control signal C_PB2 for the memory cell array 250. According to an example embodiment, in the COP structure, as not only the row decoder or the page buffer but also the entire or part of the peripheral circuit overlaps the memory cell array, the memory device including a plurality of planes may have a degree of integration that is further increased. Also, as described below, as the row decoders and the page buffers corresponding to the adjacent planes are disposed relative to each other, an area for disposing the peripheral circuit may be easily secured.

Figure 13:
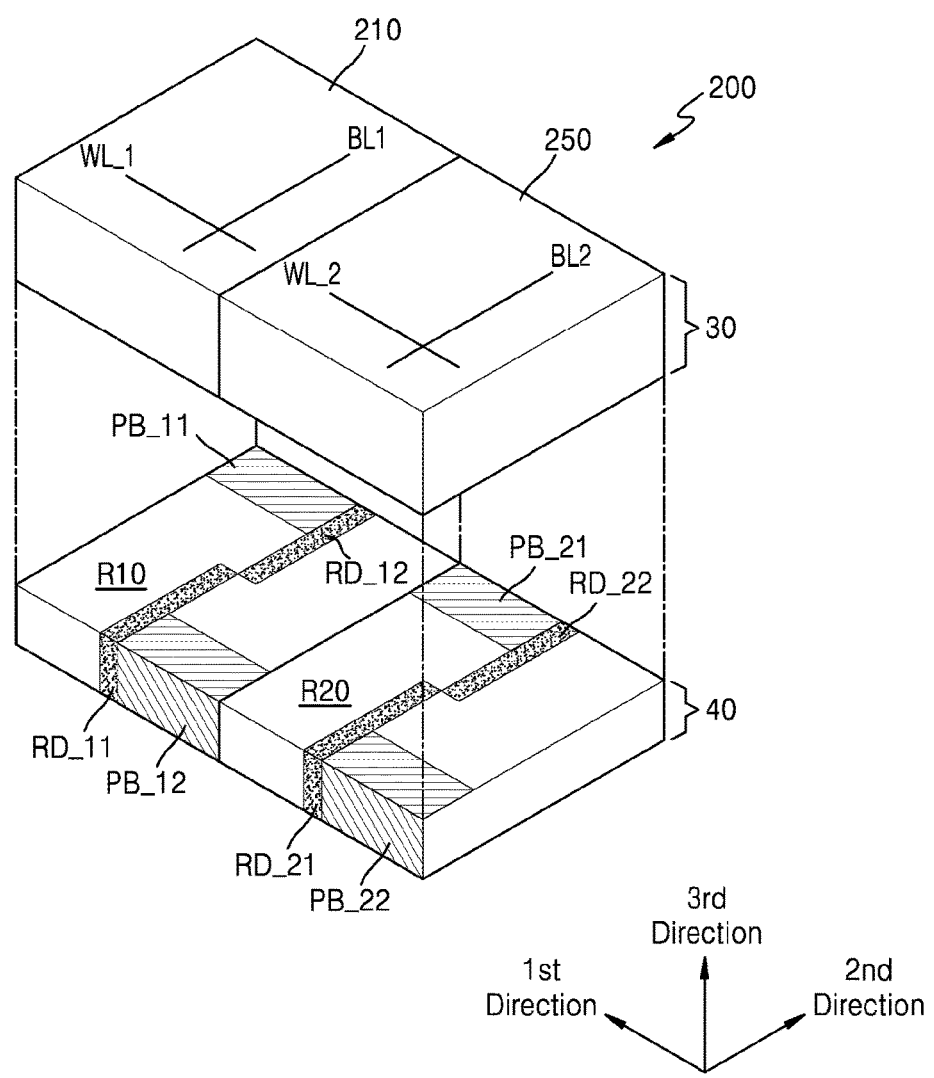
FIG. 13 schematically illustrates a structure of the memory device of FIG. 12, according to an example embodiment.

FIG. 13 schematically illustrates a structure of the memory device 200 of FIG. 12, according to an example embodiment. As described above in FIG. 2, the memory device 200 may have a COP structure in which the memory cell arrays 210 and 250 are formed on a first semiconductor layer 30 stacked on a second semiconductor layer 40 where row decoder circuits RD_11, RD_12, RD_21, and RD_22 and page buffer circuits PB_11, PB_12, PB_21, and PB_22 are formed. Also, as described above in FIGS. 7A and 7B, circuits corresponding to the row decoders 220 and 260 of FIG. 12 and circuits corresponding to the page buffers 230 and 270 may be separately disposed in the second semiconductor layer 40. Although FIG. 13 illustrates that the first and second semiconductor layers 30 and 40 are spaced apart from each other in the third direction for convenience of explanation, a lower surface of the first semiconductor layer 30 and an upper surface of the second semiconductor layer 40 are actually in contact with each other as illustrated in FIG. 2.

As illustrated in FIG. 13, the row decoder circuits RD_11 and RD_12 corresponding to the row decoder 220 of FIG. 12 and the page buffer circuits PB_11 and PB_12 corresponding to the page buffer 230 of FIG. 12 may be disposed in a first plane region R10 of the second semiconductor layer 40 corresponding to the first the memory cell array 210 of the first semiconductor layer 30. Also, the row decoder circuits RD_21 and RD_22 corresponding to the row decoder 260 of FIG. 12 and the page buffer circuits PB_21 and PB_22 corresponding to the page buffer 270 of FIG. 12 may be disposed in a second plane region R20 of the second semiconductor layer 40 corresponding to the second the memory cell array 250 of the first semiconductor layer 30.

Although FIGS. 12 and 13 illustrate that the memory device 200 includes two planes, inventive concepts are not limited thereto and a memory device according to an example embodiment may include three or more planes. For example, a memory device may include four or more planes arranged in the first and second directions of FIG. 13, or three or more planes serially arranged in the first or second direction.

Figure 14A:
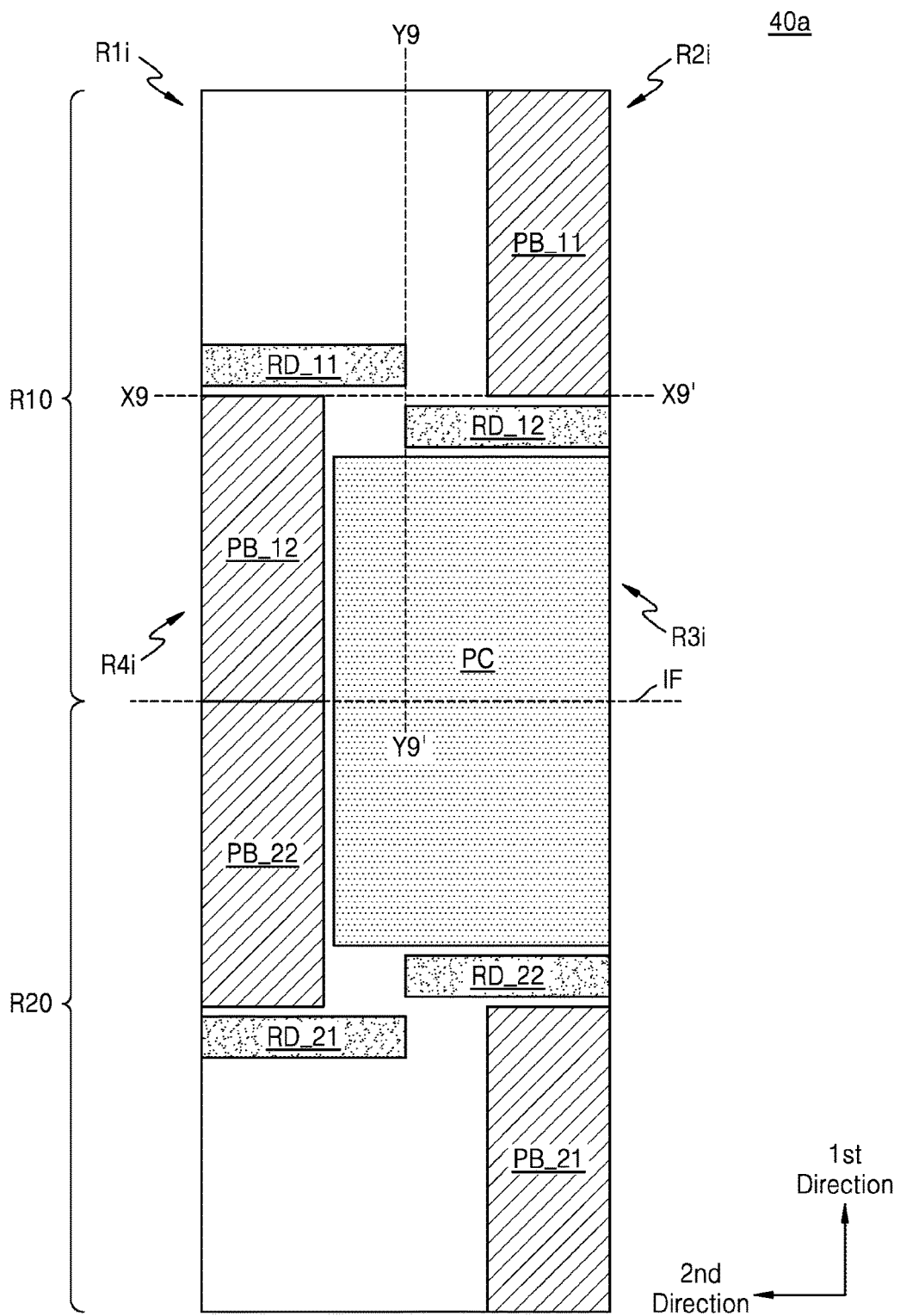
FIGS. 14A and 14B are schematic plan views of upper surfaces of examples of a second semiconductor layer contacting a first semiconductor layer in the memory device of FIG. 13, according to example embodiments.
Figure 14B:
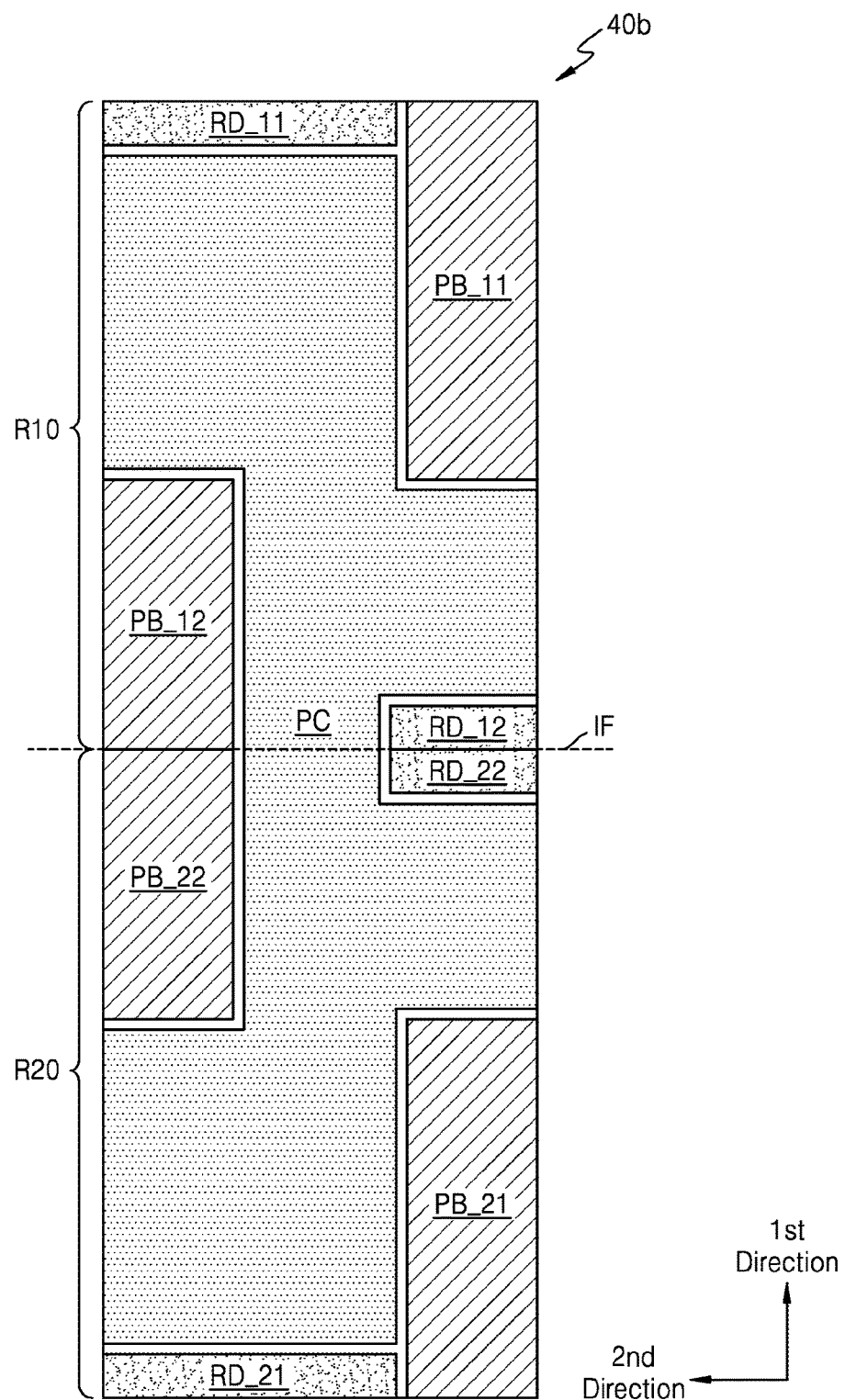

FIGS. 14A and 14B are schematic plan views of upper surfaces of examples of the second semiconductor layer 40 contacting the first semiconductor layer 30 in the memory device 200 of FIG. 13, according to example embodiments.

As illustrated in FIGS. 14A and 14B, according to example embodiments, the row decoder circuits RD_11, RD_12, RD_21, and RD_22 and the page buffer circuits PB_11, PB_12, PB_21, and PB_22 may be symmetrically disposed with respect to an interface IF between the first and second plane regions R10 and R20 in a second semiconductor layer 40a or 40b. Accordingly, a relatively large and continuous region including at least a part of the interface IF of the first and second plane regions R10 and R20 may be generated, and the peripheral circuit 240 of FIG. 12 may be disposed in the continuous region.

Referring to FIG. 14A, the row decoder circuits RD_11 and RD_12 disposed in the first plane region R10 and the row decoder circuits RD_21 and RD_22 disposed in the second plane region R20 may be symmetrically disposed with respect to the interface IF in the second semiconductor layer 40a. Also, the page buffer circuits PB_11 and PB_12 disposed in the first plane region R10 and the page buffer circuits PB_21 and PB_22 disposed in the second plane region R20 may be symmetrically disposed with respect to the interface IF in the second semiconductor layer 40a. Accordingly, the peripheral circuit PC corresponding to the peripheral circuit 240 of FIG. 12 may be disposed in a continuous region of the second semiconductor layer 40a including at least a part of the interface IF. In FIG. 14A, lines X9-X9' and Y9-Y9' are shown and regions R1i to R4i are shown to illustrate how lines similar to the virtual lines (e.g., X1-X1' and Y1-Y1' in FIG. 9A) and regions (R1a to R4a) in FIGS. 7B, 9A to 9D, 10A to 10C, and 11 may be applied to FIG. 14A. Other drawings described later, such as FIGS. 14B, 15, 16A to 16D, and 17, may be modified to include virtual lines and regions.

Referring to FIG. 14B, to increase the size of the continuous region including at least a part of the interface IF, the page buffer circuits PB_11 and PB_12 and the row decoder circuits RD_11 and RD_12 in the first plane region R10 may asymmetrically disposed, and the page buffer circuits PB21 and PB_22 and the row decoder circuits RD_21 and RD_22 in the second plane region R20 may be asymmetrically disposed. Also, the page buffer circuits PB_11 and PB_12 of the first plane region R10 may be disposed to be spaced apart from each other as far as possible, and the row decoder circuits RD_11 and RD_12 of the first plane region R10 may also be disposed to be spaced apart from each other as far as possible. Similarly, the page buffer circuits PB_21 and PB_22 of the second plane region R20 may be disposed to be spaced apart from each other as far as possible, and the row decoder circuits RD_21 and RD_22 of the second plane region R20 may also be disposed to be spaced apart from each other as far as possible. Accordingly, the continuous region including at least a part of the interface IF may have a relatively large area in the first and second regions R10 and R20, and the peripheral circuit PC may be disposed in the region including at least a part of the interface IF.

Figure 15:
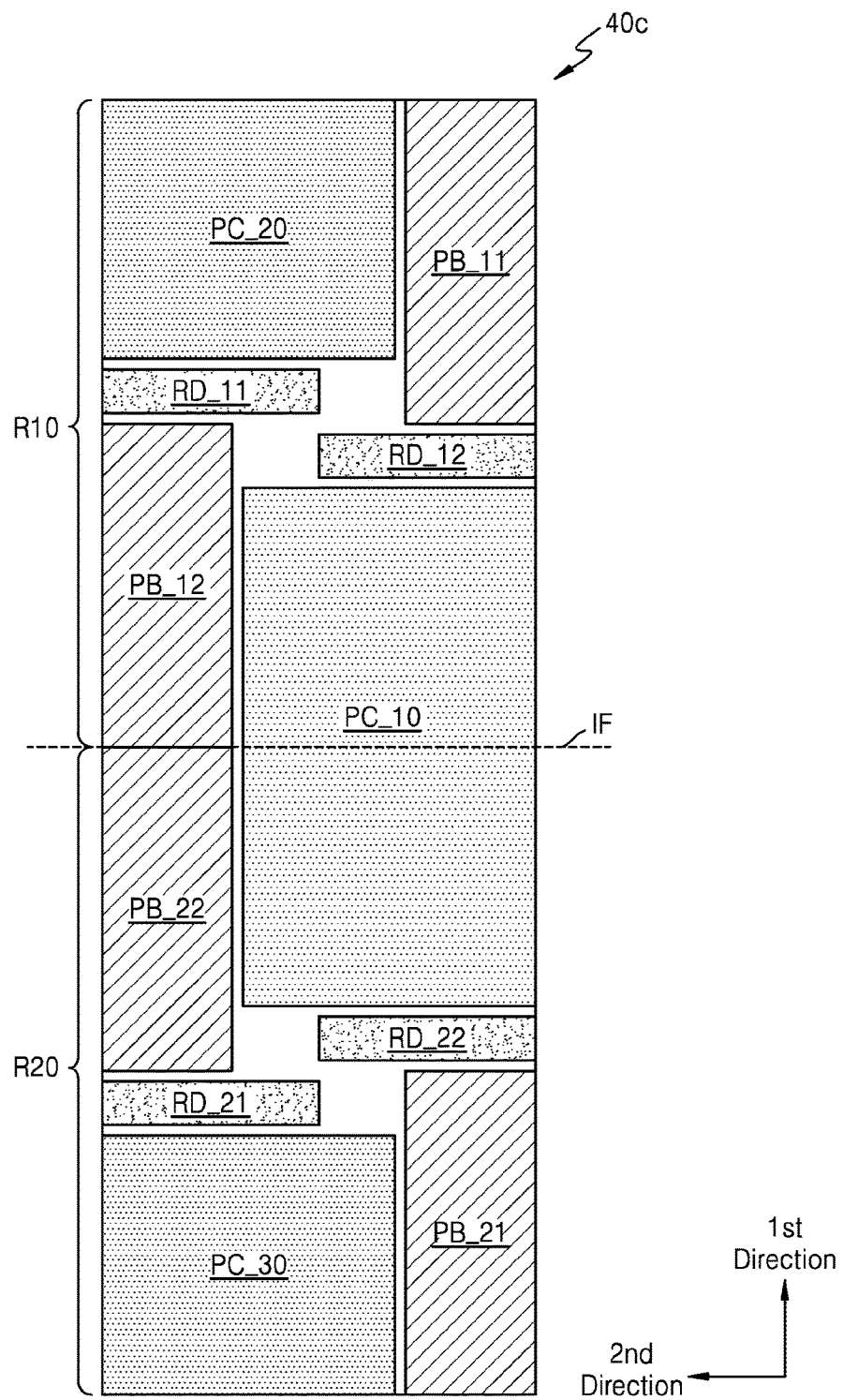
FIG. 15 is a schematic plan view of an upper surface of an example of a second semiconductor layer contacting a first semiconductor layer in the memory device of FIG. 13, according to an example embodiment.

FIG. 15 is a schematic plan view of an upper surface of the second semiconductor layer 40 contacting the first semiconductor layer 30 in the memory device 200 of FIG. 13, according to an example embodiment. Referring to FIG. 15, circuits corresponding to the peripheral circuit 240 of FIG. 12 may be disposed not only in the region including at least a part of the interface IF of the first and second plane regions R10 and R20, but also in the first plane region R10 or the second plane region R20 in a second semiconductor layer 40c. In other words, as illustrated in FIG. 15, among the sub-circuits forming the peripheral circuit 240 of FIG. 12, a sub-circuit PC_20 may be disposed in the first plane region R10 of the second semiconductor layer 40c, and a sub-circuit PC_30 may be disposed in the second plane region R20 of the second semiconductor layer 40c. As described below in FIGS. 16A to 16D, the sub-circuits PC_10, PC_20, and PC_30 forming the peripheral circuit 240 of FIG. 12 may be arranged in various ways.

FIGS. 16A to 16D illustrate examples of a disposition of the peripheral circuit 240 of FIG. 12, according to example embodiments. The peripheral circuit 240 of FIG. 12 may include the elements illustrated in FIG. 8. Although FIGS. 16A to 16D illustrate only some of the elements of the peripheral circuit 240, the elements the peripheral circuit 240 that are not illustrated may be disposed together with the illustrated elements.

Figure 16A:
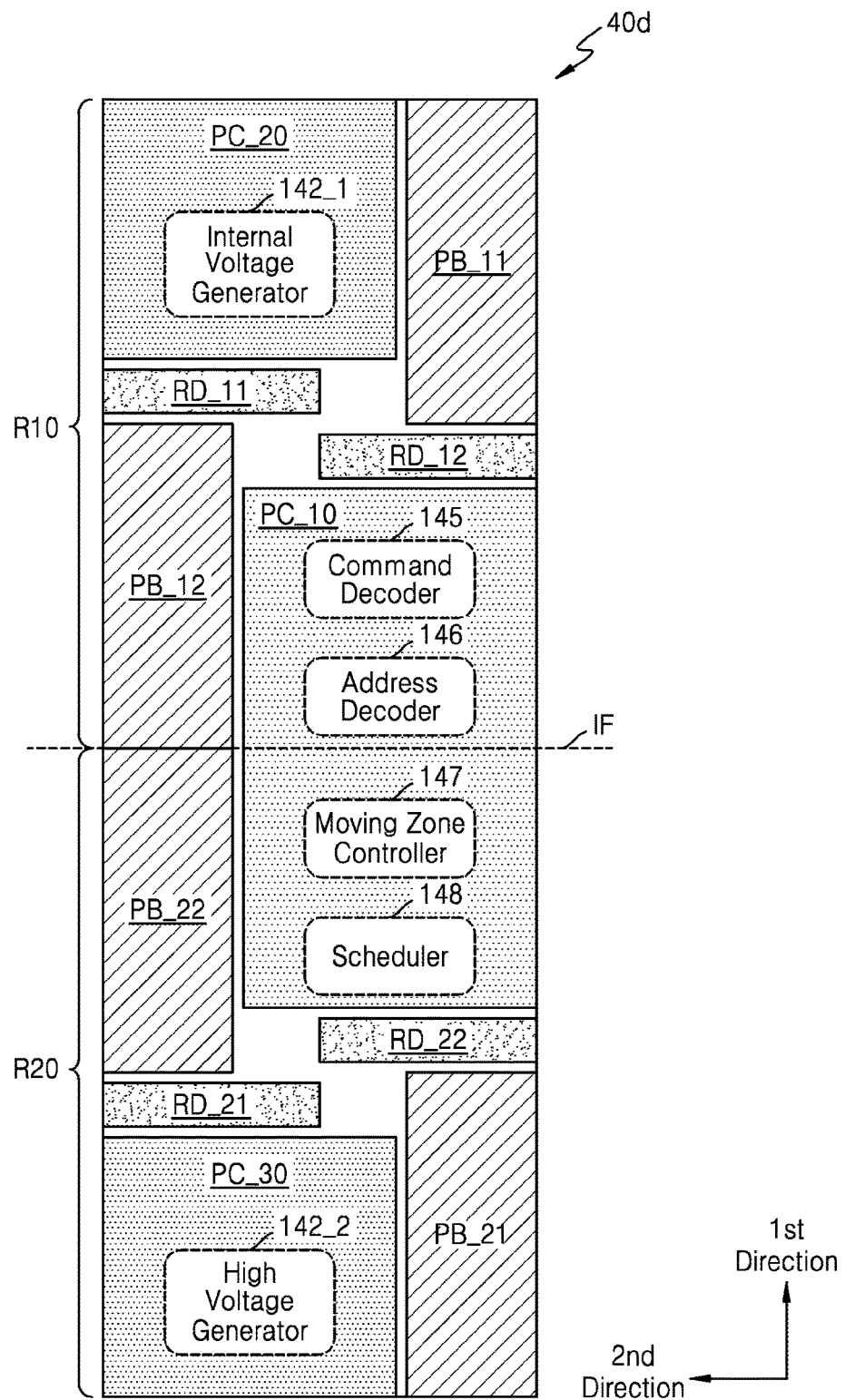
FIGS. 16A to 16D illustrate examples of an disposition of a peripheral circuit of FIG. 12, according to example embodiments.

Referring to FIG. 16A, according to an example embodiment, each of the sub-circuits PC_10, PC_20, and PC_30 of the peripheral circuit 240 separately disposed in a second semiconductor layer 40d may include circuits configured to perform different functions. For example, as illustrated in FIG. 16A, the sub-circuit PC_10 may include circuits corresponding to the command decoder 145, the address decoder 146, the moving zone controller 147, and the scheduler 148, the sub-circuit PC_20 may include a circuit corresponding to the internal voltage generator 142_1, and the sub-circuit PC_30 may include a circuit corresponding to the high voltage generator 142_2.

According to an example embodiment, circuits corresponding to the elements of the peripheral circuit 240, the elements being commonly used by the first and second memory cell arrays 210 and 250 of FIG. 12, may be disposed in an area of the second semiconductor layer 40d including at least one of the interface IF of the first and second plane regions R10 and R20. For example, as illustrated in FIG. 16A, the sub-circuit PC_10 may include circuits corresponding to the command decoder 145 and the address decoder 146. The row decoder circuits RD_11 and RD_12 and the page buffer circuits PB_11 and PB_12 disposed in the first plane region R10, and the row decoder circuits RD_21 and RD_22 and the page buffer circuits PB_21 and PB_22 disposed in the second plane region R20 may be commonly controlled by the circuits included in the sub-circuit PC_10.

Figure 16B:
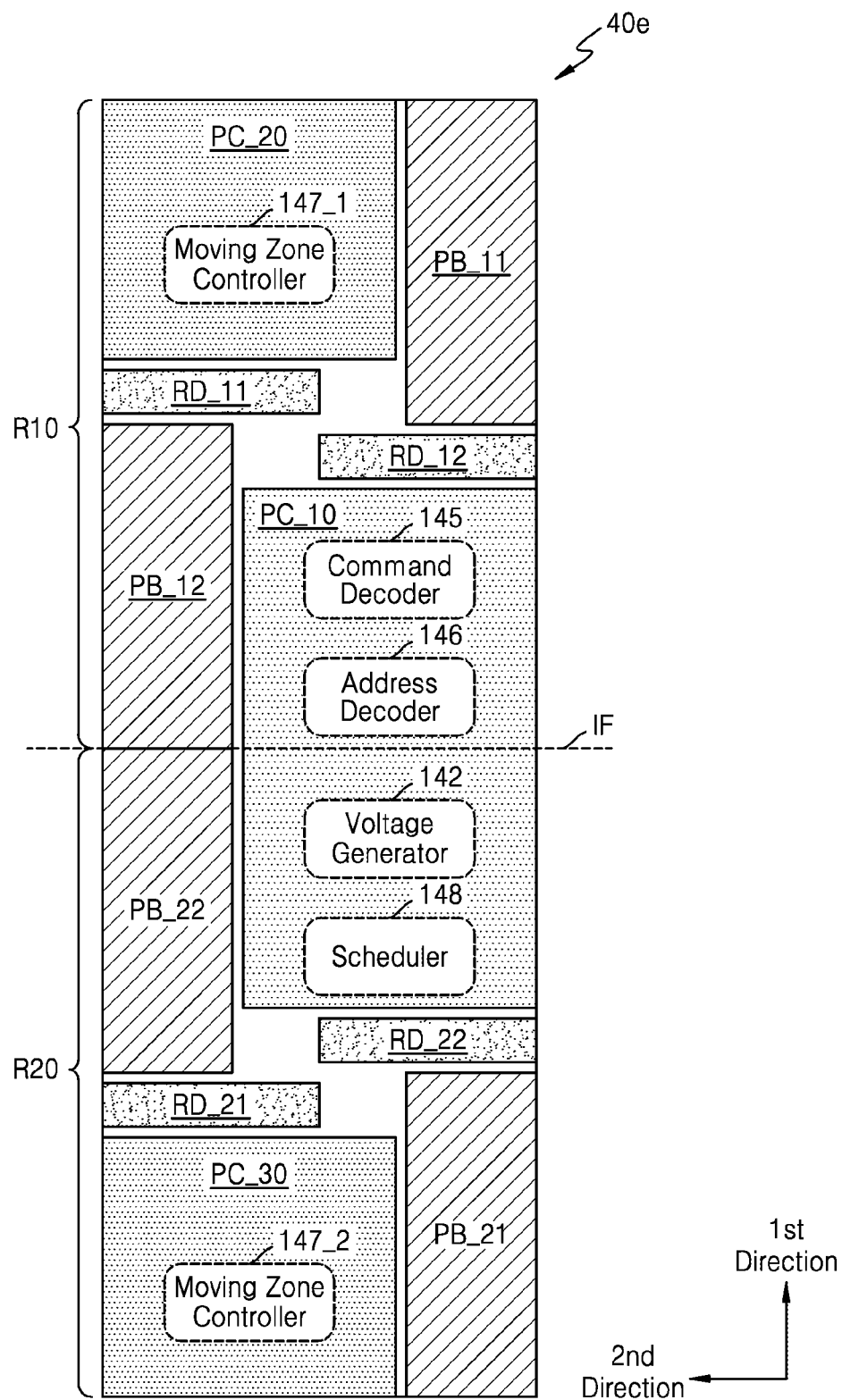

Referring to FIG. 16B, according to an example embodiment, the sub-circuits PC_10, PC_20, and PC_30 of the peripheral circuit 240 separately disposed in a second semiconductor layer 40e may include circuits configured to perform the same function, that is, redundant circuits. For example, as illustrated in FIG. 16B, while the sub-circuit PC_10 may include circuits corresponding to the command decoder 145, the address decoder 146, a voltage generator 142, and the scheduler 148, the sub-circuits PC_20 and PC_30 may include circuits corresponding to moving zone controllers 147_1 and 147_2.

Figure 16C:
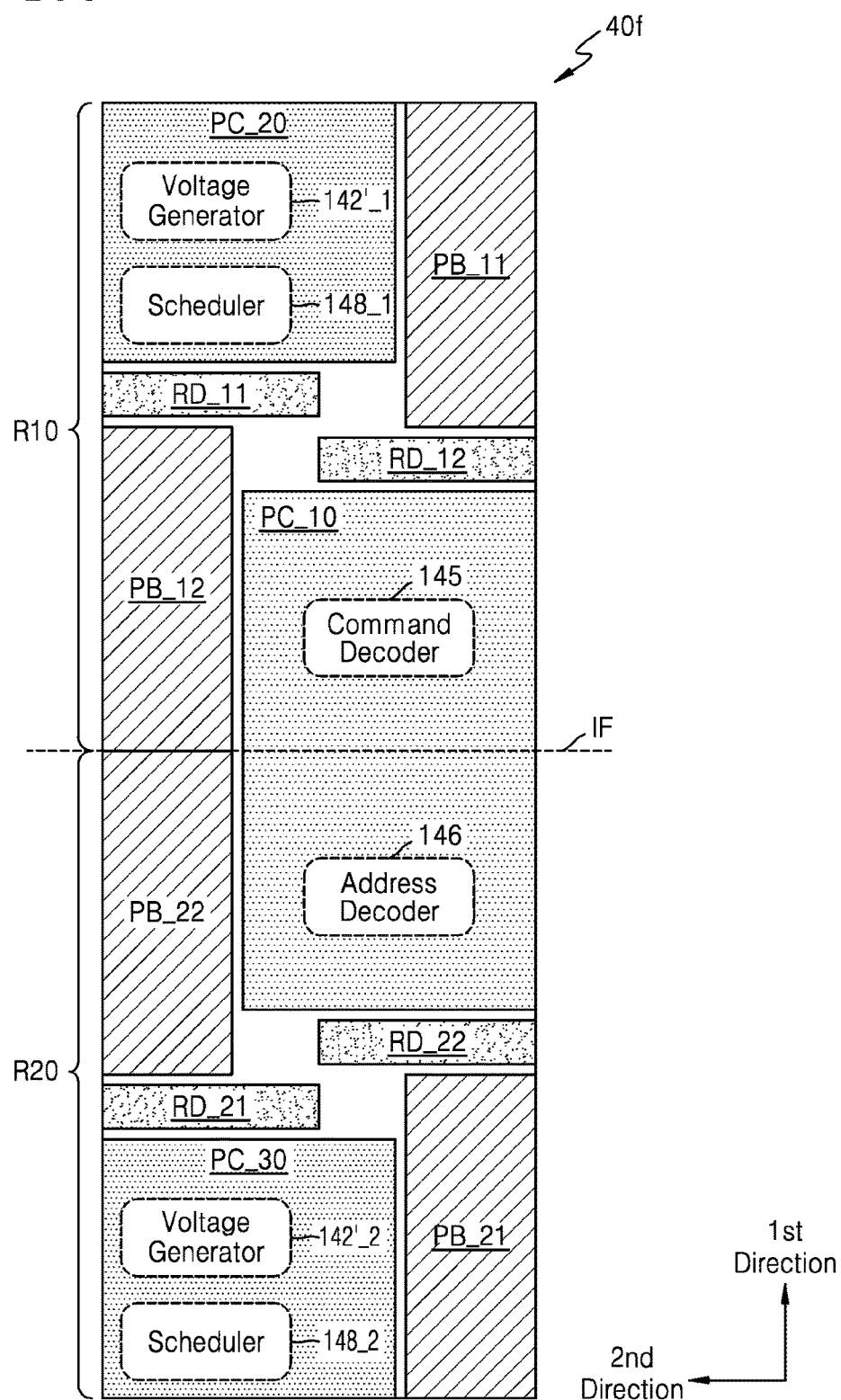

Referring to FIG. 16C, according to an example embodiment, circuits corresponding to the elements of the peripheral circuit 240, the elements being configured to perform the same function with respect to the first and second memory cell arrays 210 and 250 of FIG. 12, may be disposed in each of the first and second plane regions R10 and R20 of a second semiconductor layer 40f. For example, as illustrated in FIG. 16C, the sub-circuit PC_20 disposed in the first plane region R10 may include circuits corresponding to a voltage generator 142_1 and a scheduler 148_1 involved in the operation of the first memory cell array 210, and the sub-circuit PC_30 disposed in the second plane region R20 may include circuits corresponding to a voltage generator 142'_2 and a scheduler 148_2 involved in the operation of the second the memory cell array 250. In other words, the voltage generator 142_1 the first plane region R10 may generate voltage used for the operation of first the memory cell array 210, and the scheduler 148_1 may generate control signals to control the operation of the first the memory cell array 210. Also, the voltage generator 142'_2 of the second plane region R20 may generate voltages used for the operation of the second the memory cell array 250, and the scheduler 148_2 may generate control signals to control the operation of the second the memory cell array 250. The sub-circuit PC_10 disposed in an area of the second semiconductor layer 40f including at least a part of the interface IF of the first and second plane regions R10 and R20 may include circuits corresponding to the command decoder 145 and the address decoder 146 commonly used for the first and second memory cell arrays 210 and 250.

Figure 16D:
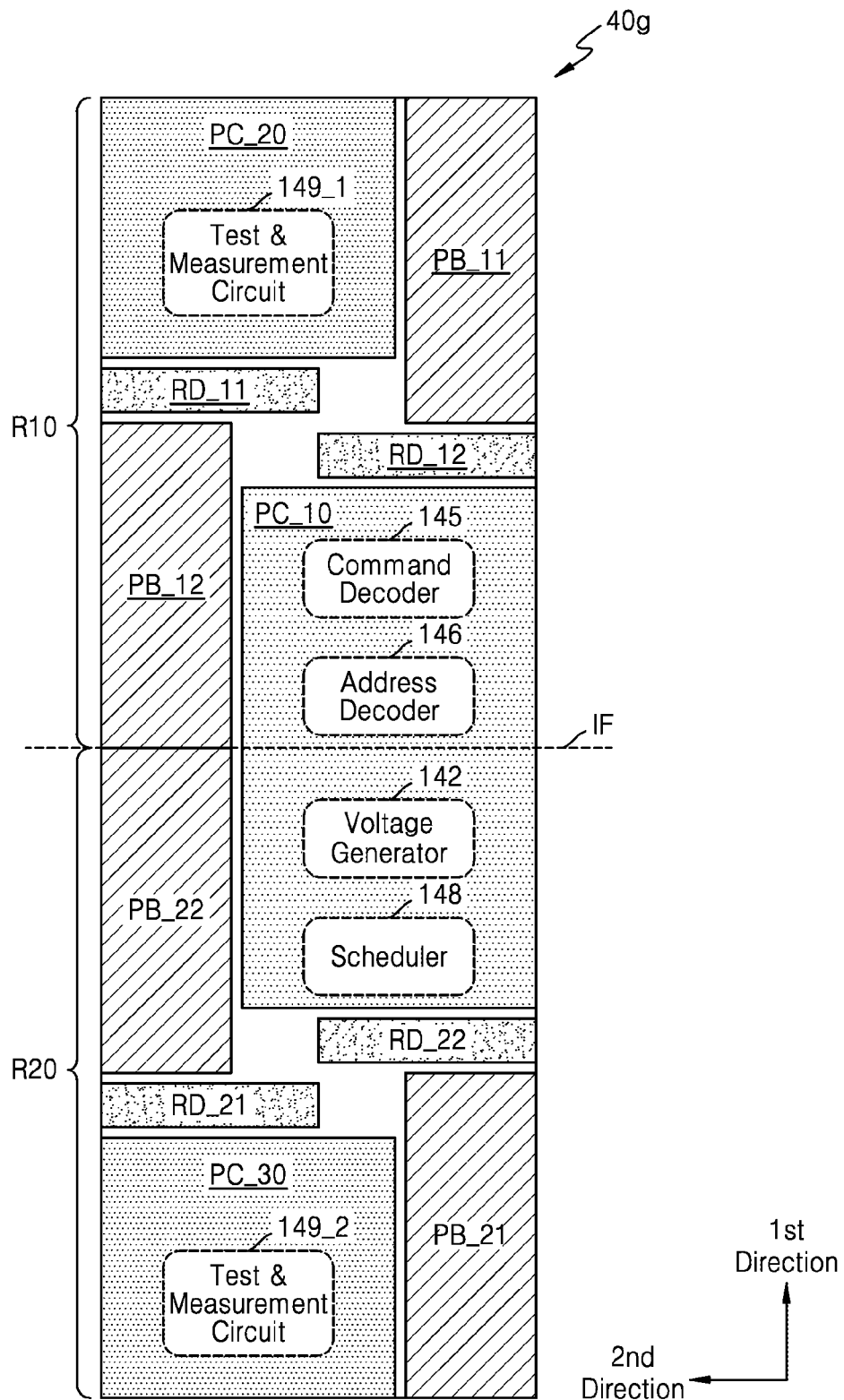

Referring to FIG. 16D, at least one of the sub-circuits PC_10, PC_20, and PC_30 of the peripheral circuit 240 may include a test and measurement circuit 149_1 or 149_2. As described above, the test and measurement circuit 149_1 or 149_2 may output a signal indicating information about the properties of the memory device 200 of FIG. 12. As illustrated in FIG. 16D, the two test and measurement circuits 149_1 and 149_2 may be respectively included in the sub-circuits PC_20 and PC_30. Alternatively, unlike the illustration of FIG. 16D, a single test and measurement circuit may be included in any one of the sub-circuits PC_10, PC_20, and PC_30.

Figure 17:
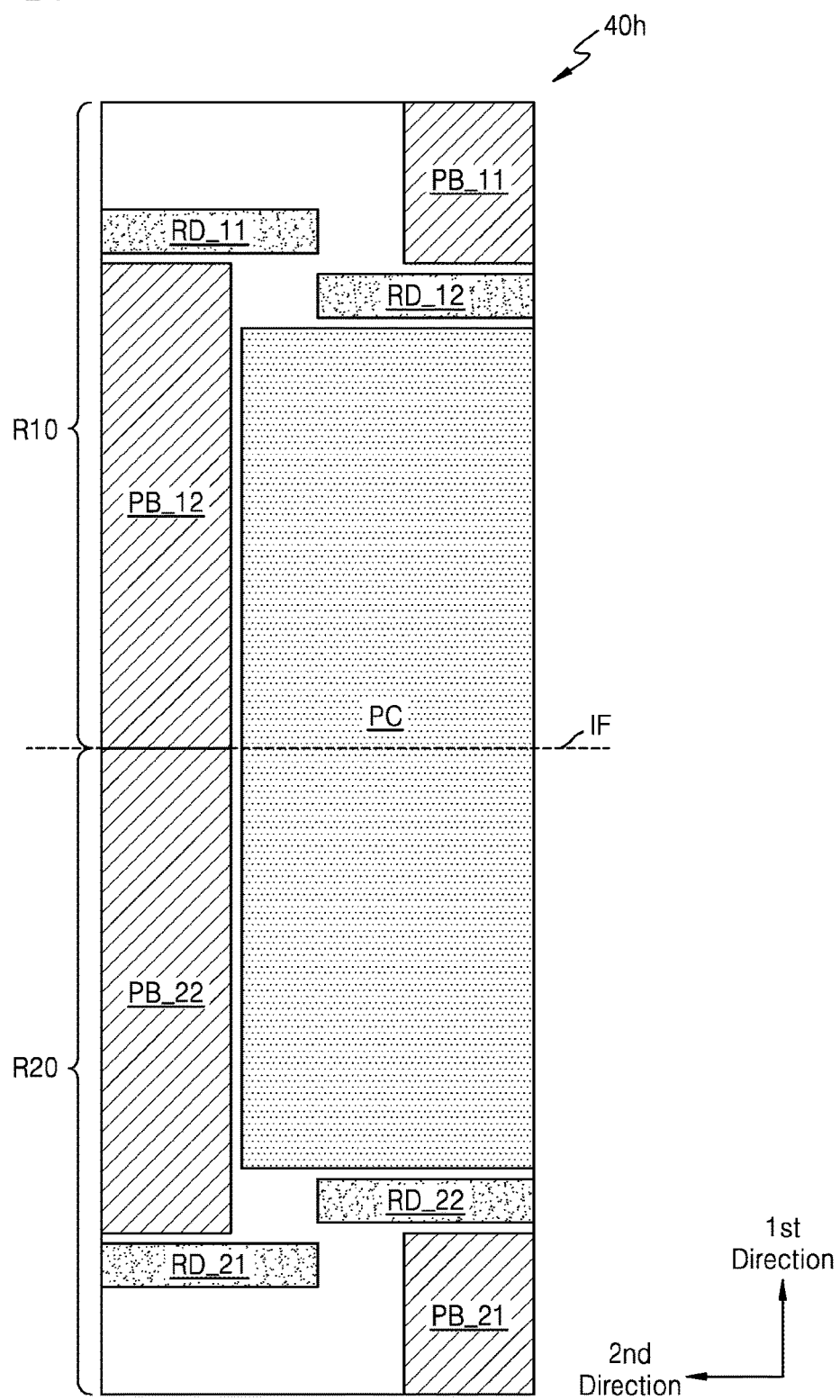
FIG. 17 illustrates an example of the disposition of the peripheral circuit of FIG. 12, according to an example embodiment.

FIG. 17 illustrates an example of the disposition of the peripheral circuit 240 of FIG. 12, according to an example embodiment. As described above in FIGS. 14 and 15, the circuits corresponding to the row decoders 220 and 260 and the page buffers 230 and 270 of FIG. 12 may be symmetrically disposed in a second semiconductor layer 40h with respect to the interface IF of the first and second plane regions R10 and R20.

According to an example embodiment, the circuits of one plane region R10 or R20 may be asymmetrically disposed as described above in FIGS. 9A and 9B. In other words, as illustrated in FIG. 17, the page buffer circuits PB_11 and PB_12 in the first plane region R10 may be asymmetrically disposed. Accordingly, compared to the example of FIG. 14, a relatively large area including a part of the interface IF of the first and second plane regions R10 and R20 in a second semiconductor layer 40*h* of FIG. 17 may be provided for disposition of the peripheral circuit 240 of FIG. 12.

Figure 18:
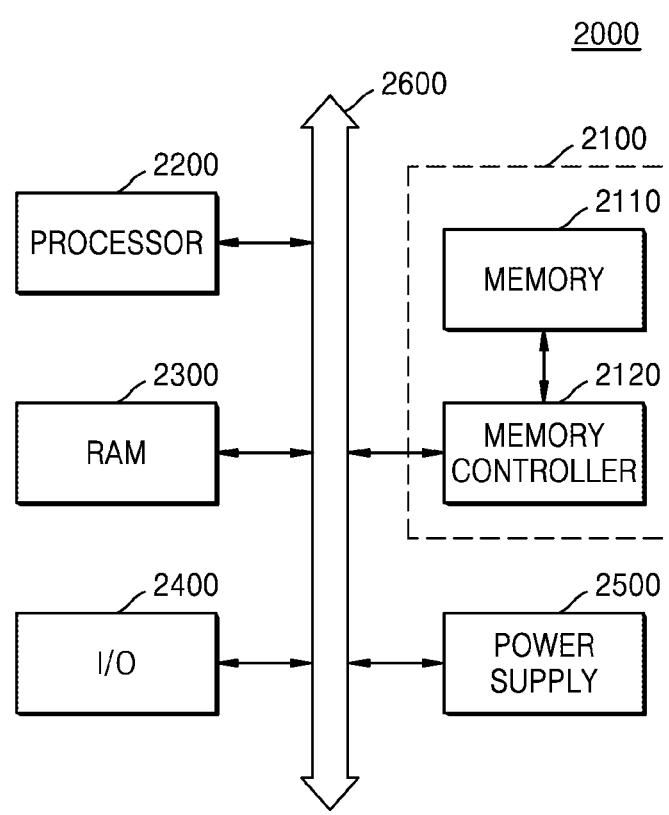
FIG. 18 is a block diagram of a computing system including a memory device, according to an example embodiment.

FIG. 18 is a block diagram of a computing system 2000 including a memory device 2110 according to example embodiments. Referring to FIG. 18, the computing system 2000 may include a memory system 2100, a processor 2200, RAM 2300, an input/output (I/O) interface 2400, and a power supply 2500. Although not illustrated in FIG. 18, the computing system 2000 may further include a port capable of communicating with a video card, a sound card, a memory card, a USB device, or other electronic systems. The computing system 2000 may be implemented with a desktop computer or a server, or a portable electronic apparatus such as a laptop computer, a mobile phone, a personal digital assistant (PDA), and a camera.

The processor 2200 may perform particular calculations or tasks. For example, the processor 2200 may be a microprocessor, a central processing unit CPU), or an application processor (AP). The processor 2200 may communicate with the RAM 2300, the input/output interface 2400, and the memory system 2100 via a bus 2600. The processor 2200 may be connected to an expansion bus such as a peripheral component interconnect (PCI) bus.

The memory system 2100 may include the memory device 2110 implemented according to example embodiments described above with reference to FIGS. 1 to 17. Accordingly, the memory device 2110 may have a high integration of memory cells, and thus, the memory system 2100 of in the computing system 2000 may have a high data storage capacity. The memory system 2100 may include a memory controller 2120 configured to operate the memory device 2110.

The RAM 2300 may store data used for the operation of the computing system 2000. For example, the RAM 2300 may be implemented with DRAM, mobile DRAM, SRAM, PRAM, FRAM, RRAM, and/or MRAM.

The input/output interface 2400 may include an input device such as a keyboard, a keypad, or a mouse, and an output device such as a printer or a display. The power supply 2500 may supply an operating voltage needed for the operation of the computing system 2000.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A memory device comprising:
a first semiconductor layer including a memory cell array that includes a plurality of word lines extending in a first direction and a plurality of bit lines extending in a second direction that crosses the first direction; and
a second semiconductor layer under the first semiconductor layer in a third direction perpendicular to the first and second directions such that the first semiconductor layer is on the second semiconductor layer,
the second semiconductor layer including a substrate, a plurality of row decoder circuits, a plurality of page buffer circuits, and a peripheral circuit,
the plurality of row decoder circuits at least partially overlap the memory cell array in the third direction,
the plurality of page buffer circuits at least partially overlap the memory cell array in the third direction,
at least two row decoder circuits of the plurality of row decoder circuits have different areas or at least two page buffer circuits of the plurality of page buffer circuits have different areas, and at least one of,
a number of the plurality of word lines connected to a first row decoder circuit among the at least two row decoder circuits is less than a number of plurality of word lines connected to a second row decoder circuit among the at least two row decoder circuits, and
a number of the plurality of bit lines connected to a first page buffer circuit among the at least two page buffer circuits is less than a number of the plurality of bit lines to a second page buffer circuit among the at least two page buffer circuits.

2. The memory device of claim 1, wherein
the second semiconductor layer includes a first region, a second region, a third region, and a fourth region sectioned by two virtual lines in the first direction and the second direction intersecting with each other at a point overlapping the memory cell array in the third direction,
the plurality of row decoder circuits include a first decoder circuit and a second row decoder circuit, respectively, in the first region and the third region,
the plurality of page buffer circuits include a first page buffer circuit and a second page buffer circuit, respectively, in the second region and the fourth region,
the peripheral circuit is in at least one region among the first region, the second region, the third region, and the fourth region, and
the first region and the third region have different areas from each other, or the second region and the fourth region have different areas from each other.

3. The memory device of claim 2, wherein
the first region and the second region are adjacent to each other in the second direction, and the third region and the fourth region are adjacent to each other in the second direction.

4. The memory device of claim 2, wherein the first page buffer circuit and the second page buffer circuit are spaced apart from each other as far as possible in the second region and the fourth region, respectively, or adjacent to each other at a position where the two virtual lines intersect each other.

5. The memory device of claim 2, wherein the first row decoder circuit and the second row decoder circuit are spaced apart from each other as far as possible in the first region and the third region, respectively, or adjacent to each other at a position where the two virtual lines intersect each other.

6. The memory device of claim 2, wherein
the memory cell array includes a first sub-array and a second sub-array,
the first sub-array overlaps the first region and the fourth region in the third direction and is configured to be controlled by the first row decoder circuit,
the second sub-array overlaps the second region and the third region in the third direction and is configured to be controlled by the second row decoder circuit,
the first page buffer circuit includes page buffer sub-circuits that are separated from each other and configured to control the first sub-array and the second sub-array respectively, and the second page buffer circuit includes page buffer sub-circuits that are separated from each other and configured to control the first sub-array and the second sub-array respectively.

7. The memory device of claim 2, wherein the first region, the second region, the third region, and the fourth region are overlapped by the memory cell array in the third direction.

8. The memory device of claim 1, wherein each of the plurality of page buffer circuits include a write circuit, a read circuit, and a plurality of latches.

9. The memory device of claim 1, wherein the number of the word lines electrically connected to the first row decoder circuit is less than the number of the word lines electrically connected to the second row decoder circuit.

10. The memory device of claim 1, wherein the number of the bit lines electrically connected to the first page buffer circuit is less than from the number of the bit lines electrically connected to the second page buffer circuit.

11. A memory device comprising:
a first semiconductor layer including a first memory cell array and a second memory cell array that are adjacent to each other in a horizontal direction; and
a second semiconductor layer under the first semiconductor layer in a vertical direction such that the first semiconductor layer is on the second semiconductor, the second semiconductor layer including a substrate, a first row decoder circuit and a first page buffer circuit that are configured to control the first memory cell array, a second row decoder circuit and a second page buffer circuit that are configured to control the second memory cell array, and a peripheral circuit,
the first row decoder circuit and the first page buffer circuit being in a first plane region of the second semiconductor layer,
the first plane region overlapping the first memory cell array in a vertical direction,
the second row decoder circuit and the second page buffer circuit being in a second plane region of the second semiconductor layer,
the second plane region overlapping the second memory cell array in the vertical direction, and
the peripheral circuit including a first sub-circuit in an area of the second semiconductor layer that includes at least a part of an interface between the first and second plane regions and at least partially overlaps the first and second memory cell arrays in the vertical direction.

12. The memory device of claim 11, wherein
the first row decoder circuit and the second row decoder circuit are symmetrically arranged with respect to the interface between the first plane region and the second plane region, and
the first page buffer circuit and the second page buffer circuit are symmetrically arranged with respect to the interface between the first plane region and the second plane region.

13. The memory device of claim 12, wherein
the first row decoder circuit includes a first row decoder sub-circuit and a second row decoder sub-circuit separated from each other, and
the first row decoder sub-circuit and the second row decoder sub-circuit have areas that are different from each other.

14. The memory device of claim 12, wherein
the first page buffer circuit includes a first page buffer sub-circuit and a second page buffer sub-circuit that are separated from each other, and the first page buffer sub-circuit and the second page buffer sub-circuit have areas that are different from each other.

15. The memory device of claim 11, wherein
the first sub-circuit includes an address buffer and a command decoder, and
the address buffer and the command decoder are configured to control the first row decoder circuit and the second row decoder circuit and the first page buffer circuit and the second page buffer circuit.

16. A memory device comprising:
a first semiconductor layer including a first memory cell array; and
a second semiconductor layer connected to the first semiconductor layer,
the second semiconductor layer including a plurality of row decoder circuits, a plurality of page buffer circuits, and at least one peripheral circuit,
the first semiconductor layer being on top of the second semiconductor layer,
the plurality of row decoder circuits including a first row decoder circuit and a second row decoder circuit,
the plurality of page buffer circuits including a first page buffer circuit and a second page buffer circuit,
the first memory cell array being on top of a plane region in the second semiconductor layer that includes the first row decoder circuit, the second row decoder circuit, the first page buffer circuit, the second page buffer circuit, and a portion of the at least one peripheral circuit,
wherein the first semiconductor layer further includes a second memory cell array adjacent to the first memory cell array in a horizontal direction,
the plane region of the second semiconductor layer is a first plane region, and
the second semiconductor layer includes a second plane region under the second memory cell array.

17. The memory device of claim 16, wherein
an area of the first page buffer circuit is different than an area of the second page buffer circuit,
the plane region in the second semiconductor layer includes a first region, a second region, a third region, and a fourth region sectioned by two virtual lines that intersect each other at a point underneath the first memory cell array, and
the first row decoder circuit and the second row decoder circuit are in the first region and the third region of the second semiconductor layer, respectively.

18. The memory device of claim 16, wherein
the plane region in the second semiconductor layer includes a first region, a second region, a third region, and a fourth region sectioned by two virtual lines that intersect each other at a point underneath the first memory cell array,
the first row decoder circuit and the second row decoder circuit are in the first region and the third region of the second semiconductor layer,
the at least one peripheral circuit includes a plurality of sub-circuits separately arranged in at least two regions among the first region, to fourth regions.

19. The memory device of claim 16, wherein
the first memory cell array includes a plurality of strings, and
each of the plurality of strings includes a plurality of memory cells stacked on top of each other in a vertical direction.

* * * * *